US012620783B1

(12) United States Patent　　(10) Patent No.:　US 12,620,783 B1
Carlson et al.　　　　　　　　　(45) Date of Patent:　　May 5, 2026

(54) METHODS FOR 3D-INTEGRATING PHOTONIC CHIPSETS BY VERTICAL ASSEMBLY OF LASERS AND PASSIVE COMPONENTS

(71) Applicant: HRL Laboratories, LLC, Malibu, CA (US)

(72) Inventors: John Carlson, Westlake Village, CA (US); Travis Autry, Calabasas, CA (US); Florian Herrault, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 411 days.

(21) Appl. No.: 18/199,944

(22) Filed: May 20, 2023

(51) Int. Cl.
　　*H01S 5/40*　　　(2006.01)
　　*H01S 5/02*　　　(2006.01)
　　　　　(Continued)

(52) U.S. Cl.
　　CPC ............ *H01S 5/405* (2013.01); *H01S 5/0216* (2013.01); *H01S 5/0217* (2013.01);
　　　　　(Continued)

(58) Field of Classification Search
　　CPC .. H01S 5/0216; H01S 5/0217; H01S 5/02326; H01S 5/0233; H01S 5/0235;
　　　　　(Continued)

(56) References Cited

U.S. PATENT DOCUMENTS

| | | |
|---|---|---|
| 3,353,115 A | 11/1967 | Maiman |
| 4,956,844 A | 9/1990 | Goodhue |

(Continued)

FOREIGN PATENT DOCUMENTS

| | | | | |
|---|---|---|---|---|
| DE | 102022127066 A1 * | 4/2024 | ............. | H01S 5/405 |
| DE | 102023124035 A1 * | 3/2025 | ........... | H01S 5/4018 |
| EP | 0590232 A1 * | 4/1994 | ........... | H01S 5/0233 |

OTHER PUBLICATIONS

Tsai et al., "Three-dimensional coupling structure for a high power laser diode module", OSA Continuum, vol. 4, No. 10, Oct. 15, 2021.

*Primary Examiner* — Christine S. Kim
*Assistant Examiner* — Tien Tran
(74) *Attorney, Agent, or Firm* — O'Connor & Company; Ryan P. O'Connor

(57)　　　　　ABSTRACT
A method for making a vertically arranged array of edge-emitting lasers comprises: obtaining semiconductor chips that are laser diodes or semiconductor optical amplifiers; coating each of the semiconductor chips with a thermally conductive dielectric material; bonding the semiconductor chips onto a carrier wafer, such that the semiconductor chips are vertically aligned; coating the semiconductor chips with an electroplating seed material; obtaining a body wafer having lithographically defined and passivated openings; positioning the body wafer and the carrier wafer to match the openings; electroplating a metal-containing material onto the seed material to fill open space; demounting the body wafer from the carrier wafer; etching excess material from the body wafer; and patterning metal regions in electrical contact with the semiconductor chips. A vertically arranged array of edge-emitting lasers is fabricated and is capable of emitting laser light parallel to the semiconductor chips and perpendicular to the plane of the body wafer.

30 Claims, 16 Drawing Sheets

(51) Int. Cl.

| | |
|---|---|
| *H01S 5/02326* | (2021.01) |
| *H01S 5/0233* | (2021.01) |
| *H10H 20/858* | (2025.01) |

(52) U.S. Cl.
CPC ........ *H01S 5/02326* (2021.01); *H01S 5/0233* (2021.01); *H10H 20/858* (2025.01)

(58) Field of Classification Search
CPC .... H01S 5/02469; H01S 5/4031; H01S 5/405; H10H 20/858; C25D 7/123
See application file for complete search history.

(56) References Cited

U.S. PATENT DOCUMENTS

| | | | |
|---|---|---|---|
| 5,159,603 A | | 10/1992 | Kim |
| 5,253,263 A | | 10/1993 | Jansen et al. |
| 5,492,607 A | | 2/1996 | Yap |
| 5,568,574 A | | 10/1996 | Tanguay et al. |
| 5,985,684 A | * | 11/1999 | Marshall ............... H01S 5/0233 |
| | | | 438/118 |
| 7,349,601 B2 | | 3/2008 | Dietrich et al. |
| 8,553,737 B2 | | 10/2013 | Cutillas et al. |
| 8,615,028 B1 | | 12/2013 | Sayyah et al. |
| 9,008,139 B2 | | 4/2015 | Monadgemi et al. |
| 9,052,460 B2 | | 6/2015 | Won et al. |
| 9,147,990 B2 | | 9/2015 | Dueck |
| 9,337,124 B1 | | 5/2016 | Herrault et al. |
| 9,575,325 B2 | | 2/2017 | Chann et al. |
| 9,837,372 B1 | | 12/2017 | Herrault et al. |
| 9,977,152 B2 | | 5/2018 | Zhang et al. |
| 10,026,672 B1 | | 7/2018 | Herrault et al. |
| 11,139,637 B2 | | 10/2021 | McLaurin et al. |
| 11,300,754 B2 | | 4/2022 | Patterson et al. |
| 11,769,843 B1 | * | 9/2023 | Yap .......................... G02B 6/42 |
| | | | 257/432 |
| 2007/0291813 A1 | | 12/2007 | Hu et al. |
| 2015/0124846 A1 | | 5/2015 | Behfar et al. |
| 2017/0117683 A1 | * | 4/2017 | Junghans .............. H01S 5/4018 |
| 2018/0375285 A1 | * | 12/2018 | Seidel ................... H01S 5/0235 |
| 2020/0036159 A1 | * | 1/2020 | Wolf ........................ B22F 7/08 |
| 2021/0233857 A1 | | 7/2021 | Herrault |
| 2021/0249838 A1 | * | 8/2021 | Schwarz .............. H01S 5/0238 |

* cited by examiner

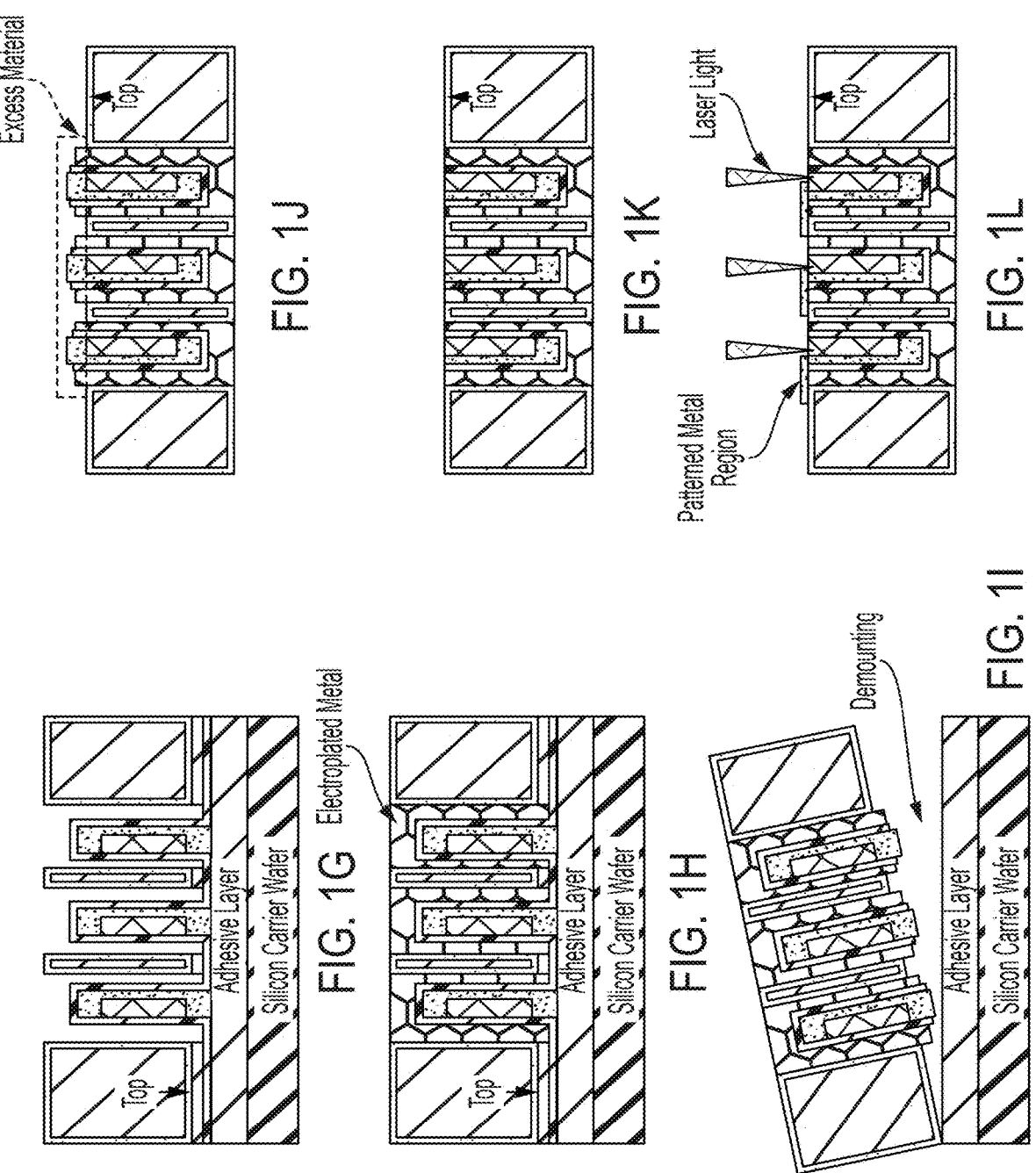

- 2D Array of Laser Die/Bars
- Allow for Area Less than Full Laser Cavity
- Emission Out-of-Plane

- 1D Arrays of Laser Die/Bars
- Requires Area of Full Laser Cavity
- Emission In-Plane Emitters at
Wavelengths
$\lambda_1, \lambda_2, \lambda_3, \lambda_4$ Single-Wavelength
Emitter Laser Light Single Passive Photonics (e.g., Lenses, Extended Cavities) Layer Active Photonics (e.g., Laser) Layer Flip-Chip Bonded Interface (Ball/Bump)

Interaction Zone

Passive Elements Block

Embedded Active Laser Arrays

METHODS FOR 3D-INTEGRATING PHOTONIC CHIPSETS BY VERTICAL ASSEMBLY OF LASERS AND PASSIVE COMPONENTS

FIELD OF THE INVENTION

The present invention generally relates to integrated photonic systems, and methods of making and using integrated photonic systems.

BACKGROUND OF THE INVENTION

A laser is a device that emits light through a process of optical amplification based on the stimulated emission of electromagnetic radiation. In 1960, researchers at Hughes Research Laboratories (now HRL Laboratories, LLC) proved that the fundamental laser concept could actually work. See U.S. Pat. No. 3,353,115, entitled "Ruby laser systems" issued to Theodore Maiman on Nov. 14, 1967. Since then, researchers at HRL Laboratories have continued to investigate and exploit the enormous advantages of optics and optoelectronics.

Lasers are ubiquitous in today's society. Lasers are used in military and law-enforcement devices for marking targets and measuring range and speed, fiber-optic communication, free-space optical communication, advanced signaling systems, semiconducting chip manufacturing (photolithography), optical disc drives, laser printers, DNA sequencing instruments, laser surgery, and cutting and welding materials, to name just a few applications.

A vertical-cavity surface-emitting laser, or VCSEL, is a type of semiconductor laser diode with laser beam emission perpendicular from the top surface. A VCSEL contrasts with an edge-emitting laser, or EEL (also known as an in-plane laser) which emits light from surfaces formed by cleaving an individual chip out of a wafer. The VCSEL structure is markedly different than the EEL structure.

Verticality is desirable for lasers since verticality allows light to escape out of the plane (perpendicular to the plane) of the semiconductor chip and be sent into a fiber or other system. While VCSELs may be vertical, they suffer from numerous performance limitations that are not present in EELs. A VCSEL has lower optical output power, narrower choice of wavelength range (typically just 770-905 nm), much broader spectral linewidth, and multi-mode beam emission. Additionally, a VCSEL is not easily extended with external cavity elements or spectral tuning structures. These limitations inherently follow from the structure utilized to cause the VCSEL to emit vertically.

As a result of these limitations, and notwithstanding the desire for vertical out-of-plane laser emission, VCSELs are not used in high-power applications, long-range LIDAR, high-performance or coherent sources, visible/UV/mid-IR lasers, photonic integrated circuits, quantum or nonlinear pump applications, long-haul telecommunications at the C-band, or in defense applications. There have been attempts to take in-plane light from an EEL and try to constrain the light to go out-of-plane, with efforts to balance the corresponding losses that occur. Techniques to mount or couple the EEL for light extraction represent an appreciable segment of the optics and microfabrication community.

In view of the aforementioned needs in the art, there is a strong desire for vertical out-of-plane laser emission from a compact and chip-scale source that can illuminate, detect, and/or interrogate objects outside of the plane of the chip.

The vertical out-of-plane laser device preferably has small size, weight, and power, as well as high power emission at a given wavelength.

SUMMARY OF THE INVENTION

The present invention addresses the aforementioned needs in the art, as will now be summarized and then further described in detail below.

In some variations, the invention provides a method for making a vertically arranged array of edge-emitting lasers, the method comprising:

(a) obtaining a plurality of semiconductor chips, wherein the semiconductor chips are laser diodes or semiconductor optical amplifiers;

(b) coating each of the semiconductor chips on multiple sides with a thermally conductive dielectric material;

(c) bonding the semiconductor chips onto a carrier wafer at selected locations, wherein the semiconductor chips are vertically aligned relative to a surface of the carrier wafer;

(d) coating each of the semiconductor chips with an electroplating seed material;

(e) obtaining a body wafer having lithographically defined and passivated openings within a plane of the body wafer;

(f) positioning the body wafer and the carrier wafer to match the lithographically defined and passivated openings with the semiconductor chips;

(g) electroplating a metal-containing material onto the electroplating seed material to fill open space between the semiconductor chips and the lithographically defined and passivated openings;

(h) demounting the body wafer from the carrier wafer;

(i) etching excess material, if any, from the body wafer; and (j) patterning a plurality of metal regions in electrical contact with the plurality of semiconductor chips, thereby generating a vertically arranged array of edge-emitting lasers that is capable of emitting laser light parallel to the semiconductor chips and perpendicular to the plane of the body wafer.

In some embodiments, the semiconductor chips are all laser diodes that emit light at the diode's junction when pumped with electrical current. In other embodiments, the semiconductor chips include both laser diodes and semiconductor optical amplifiers. In certain embodiments, the semiconductor chips are all semiconductor optical amplifiers that amplify light by stimulated emission.

The semiconductor chips may be capable of emitting or amplifying ultraviolet laser light, visible laser light, infrared laser light, or a combination thereof. In some embodiments, the semiconductor chips are each configured to emit or amplify at a single light wavelength. In some embodiments, the semiconductor chips are collectively configured to emit or amplify at multiple light wavelengths.

The semiconductor chips may be fabricated from a semiconductor selected from the group consisting of GaAs, InP, GaSb, GaN, InGaN, AlGaN, AlGaInP, GaInP, GaAlAs, InGaAs, InGaAsP, GaInAsSb, and combinations thereof, for example.

The thermally conductive dielectric material may be selected from the group consisting of aluminum nitride, boron nitride, tantalum oxide, beryllium oxide, aluminum oxide, and combinations thereof. Other thermally conductive dielectric materials include, but are not limited to, silicon nitride, zirconium oxide, hafnium oxide, and silicon oxide.

In some methods, step (b) comprises coating each of the semiconductor chips on five sides with the thermally conductive dielectric material.

In some methods, step (c) utilizes an adhesive for the bonding. The adhesive may be selected from the group consisting of polyimide, cyanoacrylate, acrylic, polyepoxides, polyethylene, polystyrene, ceramics, benzocyclobutene, parylene, and combinations thereof.

The body wafer may be fabricated from a body-wafer material selected from the group consisting of silicon, silicon carbide, germanium, gallium nitride, aluminum nitride, gallium oxide, silica, alumina, and combinations thereof.

The body wafer is preferably selected to have a thickness that is greater than the longest semiconductor-chip cavity length (e.g., laser-diode cavity length).

The carrier wafer may be fabricated from a carrier-wafer material selected from the group consisting of silicon, silicon carbide, germanium, gallium nitride, aluminum nitride, gallium oxide, silica, alumina, and combinations thereof.

The electroplating seed material may be selected from the group consisting of copper, ruthenium, molybdenum, cobalt, titanium, platinum, gold, silver, nickel, chromium, aluminum, tantalum nitride, and combinations thereof.

In some methods, step (d) comprises coating each of the semiconductor chips on five sides with the electroplating seed material.

The lithographically defined and passivated openings are characterized by an average cavity length. In some embodiments, the vertically arranged array of edge-emitting lasers is characterized by an average array pitch that is less than the average cavity length in at least one planar dimension.

In some methods, step (e) comprises obtaining a starting body wafer, etching the starting body wafer to create etched openings, and then passivating the etched openings to create the lithographically defined and passivated openings.

In some methods, passivating utilizes (i) native oxidation of the etched openings, (ii) deposition of an oxide layer onto the etched openings, and/or (iii) deposition of a nitride layer onto the etched openings.

The metal-containing material in step (g) may be selected from the group consisting of copper, ruthenium, molybdenum, cobalt, titanium, gold, silver, nickel, aluminum, indium, tin, and combinations thereof.

In some embodiments, the metal-containing material is chemically the same as the electroplating seed material. In other embodiments, the metal-containing material is chemically different than the electroplating seed material.

In some methods, step (i) comprises etching excess thermally conductive dielectric material. In these or other methods, step (i) may comprise etching excess electroplating seed material. In these or other methods, step (i) may comprise etching excess metal-containing material. In certain methods, step (i) comprises etching the excess material from the top side of the body wafer that was previously in contact with the carrier wafer prior to step (h).

The metal regions in step (j) may contain a metal selected from the group consisting of copper, nickel, titanium, platinum, palladium, rhodium, gold, silver, and combinations thereof.

In some embodiments, the vertically arranged array of edge-emitting lasers is a two-dimensional vertically arranged array of edge-emitting lasers. In some embodiments, the vertically arranged array of edge-emitting lasers is a three-dimensional vertically arranged array of edge-emitting lasers.

The method may further comprise stacking one or more passive photonic elements along with the vertically arranged array of edge-emitting lasers, to form a modular photonic system. In some embodiments, multiple vertically arranged arrays of edge-emitting lasers are stacked within the modular photonic system.

In some embodiments, the method further comprises packaging multiple vertically arranged arrays of edge-emitting lasers with optical components and drive electronics, to form an interposer platform.

In some embodiments, the method further comprises packaging multiple vertically arranged arrays of edge-emitting lasers with optical components and drive electronics, to form a photonic chipset.

Some variations of the invention provide a vertically arranged array of edge-emitting lasers produced by a process comprising:

(a) obtaining a plurality of semiconductor chips, wherein the semiconductor chips are laser diodes or semiconductor optical amplifiers;

(b) coating each of the semiconductor chips on multiple sides with a thermally conductive dielectric material;

(c) bonding the semiconductor chips onto a carrier wafer at selected locations, wherein the semiconductor chips are vertically aligned relative to a surface of the carrier wafer;

(d) coating each of the semiconductor chips with an electroplating seed material;

(e) obtaining a body wafer having lithographically defined and passivated openings within a plane of the body wafer;

(f) positioning the body wafer and the carrier wafer to match the lithographically defined and passivated openings with the semiconductor chips;

(g) electroplating a metal-containing material onto the electroplating seed material to fill open space between the semiconductor chips and the lithographically defined and passivated openings;

(h) demounting the body wafer from the carrier wafer;

(i) etching excess material, if any, from the body wafer; and (j) patterning a plurality of metal regions in electrical contact with the plurality of semiconductor chips, thereby generating a vertically arranged array of edge-emitting lasers that is capable of emitting laser light parallel to the semiconductor chips and perpendicular to the plane of the body wafer.

In some embodiments, the vertically arranged array of edge-emitting lasers does not contain any coupling structures.

In some embodiments, the lithographically defined and passivated openings are characterized by an average cavity length, and the vertically arranged array of edge-emitting lasers is characterized by an average array pitch that is less than the average cavity length in at least one planar dimension.

In some embodiments, the vertically arranged array of edge-emitting lasers is a two-dimensional or three-dimensional vertically arranged array of edge-emitting lasers.

In some embodiments, the vertically arranged array of edge-emitting lasers is present in a stacked arrangement of multiple vertically arranged arrays of edge-emitting lasers.

Some embodiments provide a modular photonic system comprising (i) one or more vertically arranged arrays of edge-emitting lasers and (ii) passive photonic elements. The modular photonic system is a non-planar photonic system, in certain embodiments.

Some embodiments provide an interposer platform comprising (i) multiple vertically arranged arrays of edge-emitting lasers, (ii) optical components, and (iii) drive electronics.

Some embodiments provide a photonic chipset comprising (i) multiple vertically arranged arrays of edge-emitting lasers, (ii) optical components, and (iii) drive electronics.

Some variations of the invention provide a vertically arranged array of edge-emitting lasers comprising:

a plurality of vertically aligned semiconductor chips each coated on multiple sides with a thermally conductive dielectric material, wherein the semiconductor chips are laser diodes or semiconductor optical amplifiers;

a body wafer having lithographically defined and passivated openings within a plane of the body wafer, wherein each of the vertically aligned semiconductor chips is positioned within individual lithographically defined and passivated openings;

an electroplated metal-containing material filled in space between the semiconductor chips and the lithographically defined and passivated opening; and a plurality of metal regions in electrical contact with the plurality of semiconductor chips, wherein the vertically arranged array of edge-emitting lasers is capable of emitting laser light parallel to the semiconductor chips and perpendicular to the plane of the body wafer.

The vertically arranged array of edge-emitting lasers preferably does not contain any coupling structures.

The lithographically defined and passivated openings are characterized by an average cavity length. In some embodiments, the vertically arranged array of edge-emitting lasers is characterized by an average array pitch that is less than the average cavity length in at least one planar dimension.

In some embodiments, an electroplating seed material is disposed between the electroplated metal-containing material and the semiconductor chips.

In some embodiments, the vertically arranged array of edge-emitting lasers is a two-dimensional vertically arranged array of edge-emitting lasers.

In some embodiments, the vertically arranged array of edge-emitting lasers is a three-dimensional vertically arranged array of edge-emitting lasers.

In some embodiments, the vertically arranged array of edge-emitting lasers is present in a stacked arrangement of multiple vertically arranged arrays of edge-emitting lasers.

Some embodiments provide a modular photonic system (e.g., a non-planar photonic system) comprising (i) one or more vertically arranged arrays of edge-emitting lasers and (ii) passive photonic elements, wherein each vertically arranged array of edge-emitting lasers comprises:

a plurality of vertically aligned semiconductor chips each coated on multiple sides with a thermally conductive dielectric material, wherein the semiconductor chips are laser diodes or semiconductor optical amplifiers;

a body wafer having lithographically defined and passivated openings within a plane of the body wafer, wherein each of the vertically aligned semiconductor chips is positioned within individual lithographically defined and passivated openings;

an electroplated metal-containing material filled in space between the semiconductor chips and the lithographically defined and passivated opening; and a plurality of metal regions in electrical contact with the plurality of semiconductor chips, wherein the vertically arranged array of edge-emitting lasers is capable of emitting laser light parallel to the semiconductor chips and perpendicular to the plane of the body wafer.

Some embodiments provide an interposer platform comprising (i) multiple vertically arranged arrays of edge-emitting lasers, (ii) optical components, and (iii) drive electronics, wherein each vertically arranged array of edge-emitting lasers comprises:

a plurality of vertically aligned semiconductor chips each coated on multiple sides with a thermally conductive dielectric material, wherein the semiconductor chips are laser diodes or semiconductor optical amplifiers;

a body wafer having lithographically defined and passivated openings within a plane of the body wafer, wherein each of the vertically aligned semiconductor chips is positioned within individual lithographically defined and passivated openings;

an electroplated metal-containing material filled in space between the semiconductor chips and the lithographically defined and passivated opening; and a plurality of metal regions in electrical contact with the plurality of semiconductor chips, wherein the vertically arranged array of edge-emitting lasers is capable of emitting laser light parallel to the semiconductor chips and perpendicular to the plane of the body wafer.

Some embodiments provide a photonic chipset comprising (i) multiple vertically arranged arrays of edge-emitting lasers, (ii) optical components, and (iii) drive electronics, wherein each vertically arranged array of edge-emitting lasers comprises:

a plurality of vertically aligned semiconductor chips each coated on multiple sides with a thermally conductive dielectric material, wherein the semiconductor chips are laser diodes or semiconductor optical amplifiers;

a body wafer having lithographically defined and passivated openings within a plane of the body wafer, wherein each of the vertically aligned semiconductor chips is positioned within individual lithographically defined and passivated openings;

an electroplated metal-containing material filled in space between the semiconductor chips and the lithographically defined and passivated opening; and a plurality of metal regions in electrical contact with the plurality of semiconductor chips, wherein the vertically arranged array of edge-emitting lasers is capable of emitting laser light parallel to the semiconductor chips and perpendicular to the plane of the body wafer.

BRIEF DESCRIPTION OF THE DRAWINGS

FIG. 1G is a side-view schematic of an exemplary process step for forming vertically arranged arrays of lasers, in which the body wafer is flipped over and positioned to match its etched openings to the laser diodes.

FIG. 1H is a side-view schematic of an exemplary process step for forming vertically arranged arrays of lasers, in which electroplating is performed to fill up the etched openings with metal around each laser diode.

FIG. 1I is a side-view schematic of an exemplary process step for forming vertically arranged arrays of lasers, in which the body wafer is demounted from the carrier wafer adhesive.

FIG. 1J is a side-view schematic of an exemplary process step for forming vertically arranged arrays of lasers, in which the demounted body wafer is flipped over.

FIG. 1K is a side-view schematic of an exemplary process step for forming vertically arranged arrays of lasers, in which the excess electroplated metal and thermal coating are etched from the topmost face of the laser diodes to open up the top laser facet.

FIG. 1L is a side-view schematic of an exemplary process step for forming vertically arranged arrays of lasers, in which metal contacts are patterned and formed to contact to the exposed laser diode contacts.

DETAILED DESCRIPTION OF EMBODIMENTS OF THE INVENTION

Figure 1A:
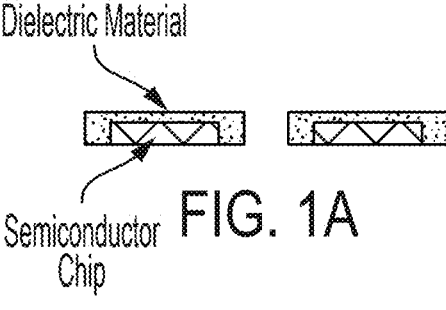
FIG. 1A is a side-view schematic of an exemplary process step for forming vertically arranged arrays of lasers, in which laser diodes with known laser cavity lengths are procured and coated in a thermal coating dielectric on five sides.

The methods, systems, and structures of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Some variations of the invention are predicated on a new packaging process to create modular photonic subsystems in which lasers and passive optics are stacked vertically and aligned at the wafer scale. The disclosed technology provides a process for the vertical packaging of an active laser layer as well as a process for the wafer-level stacking of passive optical layers atop the vertically packaged active laser layer. The disclosed processes can work for individually placed lasers or for large arrays of lasers. Many embodiments of vertically arranged arrays of edge-emitting lasers will be described, it being understood that the principles of the technology may be applied to a single vertical edge-emitting laser, if desired.

In some variations, a bottom layer is an interposer embedded with edge-emitting laser diode (LD) or edge-emitting semiconductor optical amplifier (SOA) chips that are assembled on their side and held in place by means of an electroplating process, which may be referred to as metal-embedded chip assembly. Passive layers are positioned sequentially by aligning a subsequent wafer of passive photonic elements and bonding it to the interposer surface. This layering can be repeated more than once. Each layer acts as one passive element affecting the vertically oriented beams from the active laser diode or semiconductor optical amplifier array below. These passive elements are structured to be positioned just above each embedded laser diode or semiconductor optical amplifier in the interposer. The passive elements can be prepared before or after bonding. The result is that the array of beams is optically adjusted using individual layers of lenses, filters, waveplates, extended cavities, optical spacers, and/or nonlinear crystals layer-by-layer without any additional chip area needed, due to the vertical stacking nature of the design. The as-prepared light leaves the topmost layer and emits out-of-plane. Remarkably, the out-of-plane emission is accomplished using edge-emitting lasers rather than vertical-cavity surface-emitting lasers.

In various embodiments, the process produces (1) direct out-of-plane laser emission without the need for coupling structures, (2) densely packed two-dimensional (2D) arrays in one layer where each laser diode or semiconductor optical amplifier chip is positioned in closer pitch than its cavity length, (3) thermal heat sinking on five sides of each laser diode or semiconductor optical amplifier chip in the array, and (4) an embedded electrical ground for each laser diode or semiconductor optical amplifier chip in the array.

Some variations provide a method for orienting and embedding laser bars/die to emit out-of-plane directly without the use of coupling structures. Some variations provide a method of forming a 2D array of laser bars/die where the pitch is less than the laser cavity length in at least one planar dimension. Some variations provide a method of forming densely-packed 2D arrays of laser bars/die where each laser can be a different wavelength. Some variations provide a method of improving the performance of laser bars/die by surrounding them in thermal heat sink while still maintaining the original optical output plane. Some variations provide a method of densely co-packaging a laser array, its optics, and its drive electronics together onto one interposer platform. Some variations provide a method of creating modular photonic subsystems by stacking different parts of the active and passive photonic elements vertically.

Variations of the invention can serve at least three purposes. First, the invention enables the formation of high-performance laser arrays without a corresponding large increase in chip area, by stacking elements vertically onto a small-pitch spacing of laser chips. In particular, this approach uniquely enables 2D arrays of lasers instead of being limited to 1D arrays as with conventional laser-mounting techniques. Second, the invention achieves direct vertical emission from edge-emitting/in-plane lasers, removing the need for lossy or bulky coupling elements to rotate light out-of-plane. Third, the invention wraps lasers in a thermal heat sink on all sides for better heat wicking, allowing better performance and better chip lifetime due to the improved thermal conduction profile.

Variations of the invention provide many advantages compared to the prior art. Vertical emission from high-power edge-emitting lasers is achieved without the need for inefficient coupling structures. Also, different off-the-shelf dies can be densely packaged together and thus can cover multiple wavelengths or laser types—e.g. distributed-feedback (DFB), sampled grating distributed Bragg reflector (SGDBR), or photonic integrated circuit (PIC)—in one single assembly. Additionally, 3D stacking of layers may be utilized to produce full photonic subsystems that are non-planar. The invention allows for the tiling of semiconductor laser sources in large, scalable, 1D/2D arrays; thermally heat sinks each LD or SOA chip on more than two sides; achieves high-efficiency optical output due to direct vertical emission; enables lithographically precise, wafer-scale alignment of passive elements to the end of the laser; and creates a platform for extending and lengthening laser cavities for high-performance applications.

The present invention is of interest for various applications that utilize light emission from a compact and chip-scale source that can illuminate, detect, and/or interrogate objects outside of the plane of the chip. These applications would benefit from both low size, weight, and power, as well as high power emission at a given wavelength or a range of wavelengths within one beam.

Specific applications that may employ the disclosed technology include, but are not limited to, high-efficiency long-range sensing (e.g., at 1550 nm); military-grade gyroscopes; compact pump sources for fiber-based quantum networks (e.g. in visible/UV); high-energy weaponry sources (e.g., at 980 nm); long-range sensing; on-vehicle atmospheric sensing at various wavelengths; chip-scale transceivers for vehicle bus networks (e.g., local area networks, local interconnect networks, etc.); extremely compact atomic clocks using high-performance lasers (e.g., narrow-linewidth C-band lasers); laser-based night vision and sensing; frequency conversion sources shifting infrared light to the visible spectrum for viewing; on-chip sources for frequency conversion (e.g., second harmonic generation or sum-frequency generation); bio-photonic sensors that can detect hemoglobin or other blood-borne characteristics through the skin; chip-to-chip optical interconnects for analog or neuromorphic computing systems; photonic integrated circuits; and planar lightwave circuits. In photonic integrated circuits or planar lightwave circuits using 3D-stacked chips, a vertically embedded laser source in one layer may be positioned to excite a given element in a separate chip-stack layer above. This configuration may be beneficial for emerging programmable intelligent computer or programmable logic controller applications in the non-classical computing space, such as for ion traps or color center traps.

The disclosed technology satisfies the long-felt need summarized in the Background, by positioning edge-emitting lasers on their ends using fine-pitch arrays and by providing extendable cavities using wafer-scale alignment and bonding. There exists no other known method to embed edge-emitting lasers (EELs)—as an array or as a singular die—vertically in an interposer in such a way that provides the die with its necessary electrical and thermal paths. This process is readily deployable for numerous EEL sizes and materials, and the process does not sacrifice the intrinsic advantages of a given edge-emitting laser.

In some variations, the invention provides a method for making a vertically arranged array of edge-emitting lasers, the method comprising:

(a) obtaining a plurality of semiconductor chips, wherein the semiconductor chips are laser diodes or semiconductor optical amplifiers;

(b) coating each of the semiconductor chips on multiple sides with a thermally conductive dielectric material;

(c) bonding the semiconductor chips onto a carrier wafer at selected locations, wherein the semiconductor chips are vertically aligned relative to a surface of the carrier wafer;

(d) coating each of the semiconductor chips with an electroplating seed material;

(e) obtaining a body wafer having lithographically defined and passivated openings within a plane of the body wafer;

(f) positioning the body wafer and the carrier wafer to match the lithographically defined and passivated openings with the semiconductor chips;

(g) electroplating a metal-containing material onto the electroplating seed material to fill open space between the semiconductor chips and the lithographically defined and passivated openings;

(h) demounting the body wafer from the carrier wafer;

(i) etching excess material, if any, from the body wafer; and (j) patterning a plurality of metal regions in electrical contact with the plurality of semiconductor chips, thereby generating a vertically arranged array of edge-emitting lasers that is capable of emitting laser light parallel to the semiconductor chips and perpendicular to the plane of the body wafer.

In some embodiments, the semiconductor chips are all laser diodes that emit light at the diode's junction when pumped with electrical current. In other embodiments, the semiconductor chips include both laser diodes and semiconductor optical amplifiers. In certain embodiments, the semiconductor chips are all semiconductor optical amplifiers that amplify light by stimulated emission.

The semiconductor chips may be capable of emitting or amplifying ultraviolet laser light, visible laser light, infrared laser light, or a combination thereof. In some embodiments, the semiconductor chips are each configured to emit or amplify at a single light wavelength. In some embodiments, the semiconductor chips are collectively configured to emit or amplify at multiple light wavelengths.

The semiconductor chips may be fabricated from a semiconductor selected from the group consisting of GaAs, InP, GaSb, GaN, InGaN, AlGaN, AlGaInP, GaInP, GaAlAs, InGaAs, InGaAsP, GaInAsSb, and combinations thereof, for example. Other semiconductor materials may be utilized in the semiconductor chips.

In addition to the base semiconductor material, one or more dopants may be incorporated into the semiconductor chips. Dopants may be p-type dopants or n-type dopants and may include, but are not limited to, boron, aluminum, arsenic, phosphorus, gallium, antimony, indium, bismuth, lithium, germanium, gold, platinum, and nitrogen.

The semiconductor chips are typically in the shape of a rectangular slab with six sides. Geometrically, the semiconductor chips are preferably hexahedrons, which may be rectangular cuboids in which there are three length scales (height, width, and length). The height and width may be the same or different; typically the length is greater than both the height and the width, unless the semiconductor chips are cubes. The length is referred to as the longest semiconductor-chip cavity length.

In some methods, step (b) comprises coating each of the semiconductor chips on five sides with the thermally conductive dielectric material. That is, five of six sides are coated with the thermally conductive dielectric material; one side remains uncoated with the thermally conductive dielectric material.

The thermally conductive dielectric material may be selected from the group consisting of aluminum nitride, boron nitride, tantalum oxide, beryllium oxide, aluminum oxide, and combinations thereof. Other thermally conductive dielectric materials include, but are not limited to, silicon nitride, zirconium oxide, hafnium oxide, and silicon oxide.

In some methods, step (c) utilizes an adhesive for the bonding. The adhesive may be selected from the group consisting of polyimide, cyanoacrylate, acrylic, polyepoxides, polyethylene, polystyrene, ceramics, benzocyclobutene, parylene, and combinations thereof.

The body wafer may be fabricated from a body-wafer material selected from the group consisting of silicon, silicon carbide, germanium, gallium nitride, aluminum nitride, gallium oxide, silica, alumina, and combinations thereof. The body-wafer material may be a mineral or other material that itself contains silicon, silicon carbide, germanium, gallium nitride, aluminum nitride, gallium oxide, silica, and/or alumina. For example, quartz is a crystalline mineral composed of atoms that are linked in a continuous framework of silicon-oxygen tetrahedra, with each oxygen being shared between two tetrahedra, giving an overall chemical formula of $SiO_2$. Quartz is typically at least 99.9 wt % $SiO_2$. As another example, sapphire is a precious gemstone, a variety of the mineral corundum, consisting of aluminum oxide ($\alpha$-$Al_2O_3$) with trace amounts of elements such as iron, titanium, chromium, vanadium, and magnesium.

The body wafer is preferably selected to have a thickness that is greater than the longest semiconductor-chip cavity length (e.g., the laser-diode cavity length). This selection is preferred so that when the body wafer and the carrier wafer (with bonded semiconductor chips) are positioned together during fabrication, the lithographically defined and passivated openings of the body wafer are long enough to encompass the semiconductor chips along their maximum length (cavity length).

The carrier wafer may be fabricated from a carrier-wafer material selected from the group consisting of silicon, silicon carbide, germanium, gallium nitride, aluminum nitride, gallium oxide, silica, alumina, and combinations thereof.

The electroplating seed material may be selected from the group consisting of copper, ruthenium, molybdenum, cobalt, titanium, platinum, gold, silver, nickel, chromium, aluminum, tantalum nitride, and combinations thereof.

In some methods, step (d) comprises coating each of the semiconductor chips on five sides with the electroplating seed material. That is, five of six sides are coated with the electroplating seed material; one side remains uncoated with the electroplating seed material. Note that the five sides coated with the electroplating seed material are not the same as the five sides coated earlier with the thermally conductive dielectric material. Four of the five sides are common; see FIG. 1A and FIG. 1C. In particular, a long side of a semiconductor chip originally uncoated with thermally conductive dielectric material is later coated with electroplating seed material. Then, an end of a semiconductor chip originally coated with thermally conductive dielectric material is later not coated with electroplating seed material, because the semiconductor-chip end is bonded to the carrier wafer.

In certain embodiments, the platability of the surface of the semiconductor chips is sufficient such that an electroplating seed material is not necessary. In these embodiments, the method for making a vertically arranged array of edge-emitting lasers comprises:

obtaining a plurality of semiconductor chips, wherein the semiconductor chips are laser diodes or semiconductor optical amplifiers;

coating each of the semiconductor chips on multiple sides with a thermally conductive dielectric material;

bonding the semiconductor chips onto a carrier wafer at selected locations, wherein the semiconductor chips are vertically aligned relative to a surface of the carrier wafer;

obtaining a body wafer having lithographically defined and passivated openings within a plane of the body wafer;

positioning the body wafer and the carrier wafer to match the lithographically defined and passivated openings with the semiconductor chips;

plating (e.g., via electroless plating) a metal-containing material to fill open space between the semiconductor chips and the lithographically defined and passivated openings;

demounting the body wafer from the carrier wafer;

etching excess material, if any, from the body wafer; and patterning a plurality of metal regions in electrical contact with the plurality of semiconductor chips, thereby generating a vertically arranged array of edge-emitting lasers that is capable of emitting laser light parallel to the semiconductor chips and perpendicular to the plane of the body wafer.

The lithographically defined and passivated openings are characterized by an average cavity length. In some embodiments, the vertically arranged array of edge-emitting lasers is characterized by an average array pitch that is less than the average cavity length in at least one planar dimension.

Step (e) may include obtaining a body wafer that was previously etched and passivated at another time and potentially at another location.

In some methods, step (e) comprises obtaining a starting body wafer, etching the starting body wafer to create etched openings, and then passivating the etched openings to create the lithographically defined and passivated openings. The depth of the etched openings may be all the same in magnitude, or the depth may vary for different openings. The etched openings may traverse all the way through the depth of the body wafer. Alternatively, or additionally, etched openings may be created within the bulk of the body wafer but not traverse all the way to an opposite side of the body wafer.

Figure 2B:
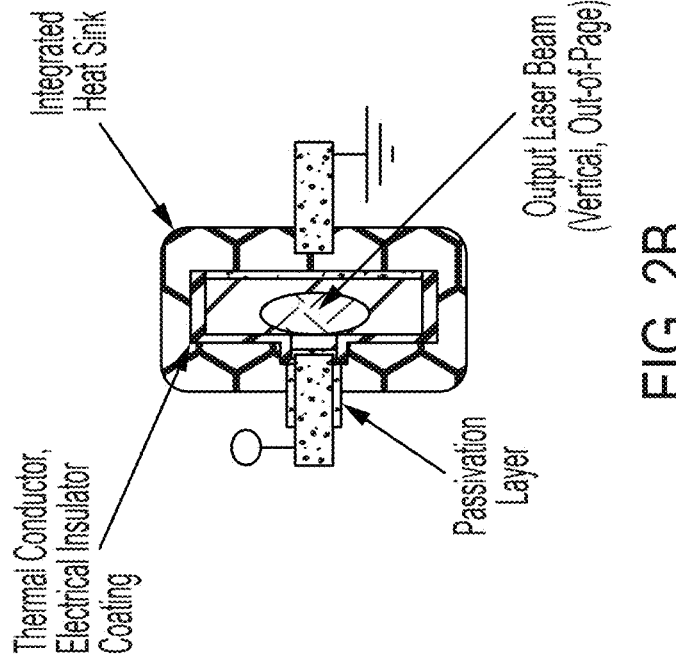
FIG. 2B shows a top-down view of a single laser diode die in the same interposer in in FIG. 2A, in some embodiments
Figure 2A:
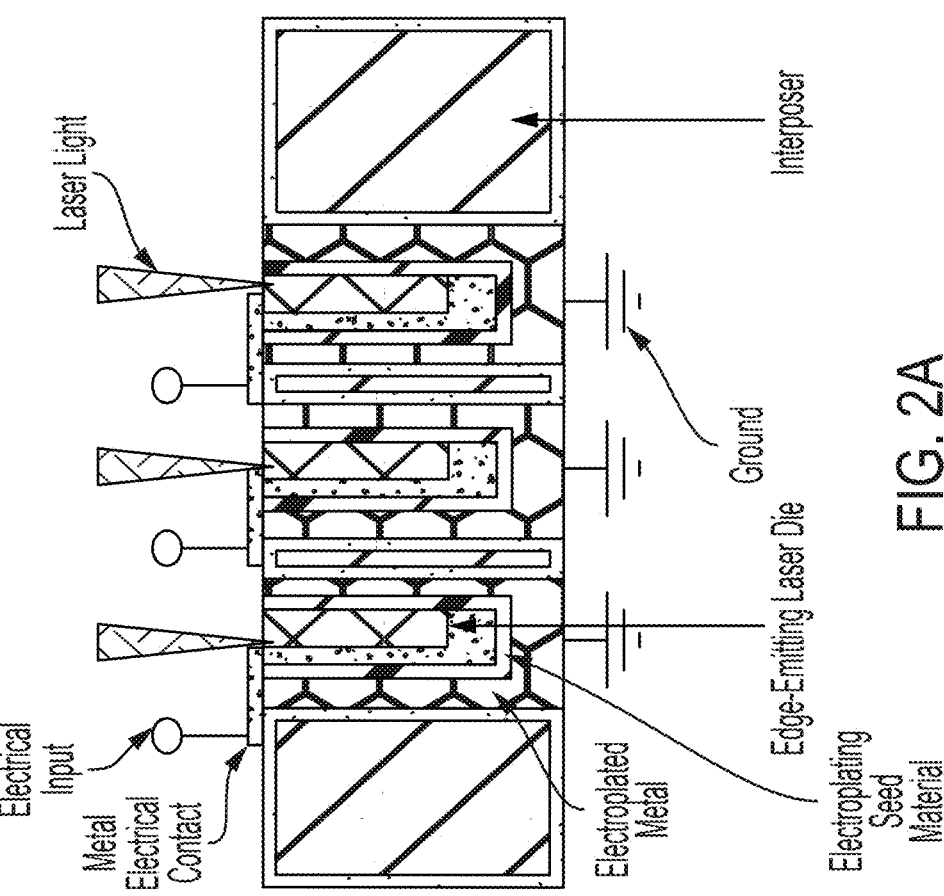
FIG. 2A shows a cross-section of an array of laser diodes that have been positioned vertically and secured in the interposer wafer surrounding them by use of electroplated metal, in some embodiments.

Etching of the body wafer may be accomplished using chemical etching, physical etching, or a combination thereof. Specific etching techniques include, but are not limited to, wet etching, plasma etching, sputter etching, micromachining, subtractive manufacturing, and mechanical polishing. A portion of the body wafer that is not etched becomes an interposer, as depicted in FIG. 2A.

Following etching the body wafer, or simultaneously with etching, the etched openings are passivated. Passivation layers may contain $Al_2O_3$, $SiO_2$, $Si_3N_4$, AlN, another material, or a combination thereof, for example. In some methods, passivating utilizes (i) native oxidation of the etched openings, (ii) deposition of an oxide layer onto the etched openings, and/or (iii) deposition of a nitride layer onto the etched openings. That is, a passivating layer may be deposited, or it may be grown directly, or both of these. As an example, when a desired passivation layer is $SiO_2$ and the body wafer is Si, silica may be deposited onto the silicon surface; alternatively, or additionally, a region of the silicon surface may be oxidized (Si→$SiO_2$) to form the passivation layer in situ.

The metal-containing material in step (g) may be selected from the group consisting of copper, ruthenium, molybdenum, cobalt, titanium, gold, silver, nickel, aluminum, indium, tin, and combinations thereof.

In some embodiments, the metal-containing material is chemically the same as the electroplating seed material. In other embodiments, the metal-containing material is chemically different than the electroplating seed material.

In some methods, step (i) comprises etching excess thermally conductive dielectric material. In these or other methods, step (i) may comprise etching excess electroplating seed material. In these or other methods, step (i) may comprise etching excess metal-containing material. In certain methods, step (i) comprises etching the excess material from the top side of the body wafer that was previously in contact with the carrier wafer prior to step (h).

Typically, there is excess thermally conductive dielectric material and/or excess electroplated metal-containing material to be etched away from the body wafer, in step (i). For example, see FIG. 1J, where the excess material is shown as material protruding from the top of the structure, and is etched away in FIG. 1K. In certain embodiments, excess thermally conductive dielectric material is etched, but either there is not excess electroplated metal-containing material, or the electroplated metal-containing material is not etched. It is beneficial to etch at least the excess thermally conductive dielectric material so that it does not interfere with edge emission out-of-plane, for example.

Etching of excess material (excess thermally conductive dielectric material and/or excess electroplated metal-containing material) may be accomplished using chemical etching, physical etching, or a combination thereof. Specific etching techniques include, but are not limited to, wet etching, plasma etching, sputter etching, micromachining, subtractive manufacturing, and mechanical polishing.

The metal regions in step (j) may contain a metal selected from the group consisting of copper, nickel, titanium, platinum, palladium, rhodium, gold, silver, and combinations thereof.

In some embodiments, the vertically arranged array of edge-emitting lasers is a two-dimensional vertically arranged array of edge-emitting lasers. In some embodiments, the vertically arranged array of edge-emitting lasers is a three-dimensional vertically arranged array of edge-emitting lasers.

In certain embodiments, a three-dimensional vertically arranged array of edge-emitting lasers is a stacked 3D array that contains a mix of laser-diode chips and edge-emitting semiconductor optical amplifier (SOA) chips. In these configurations, the bottommost layer in the stack contains edge-emitting lasers, which pump the higher layers containing SOA chips to create an amplified laser output that still emits perpendicular to the body-wafer surface.

When the array of edge-emitting lasers is a two-dimensional vertically arranged array of edge-emitting lasers, the edge-emitting lasers may all be laser diodes, or they may be a mix of laser diodes and SOA chips in a 2D configuration. When there is a 2D active layer with 3D passive layers on top, the edge-emitting lasers may all be laser diodes, or they may be a mix of laser diodes and SOA chips in the 2D active layer.

The method may further comprise stacking one or more passive photonic elements along with the vertically arranged array of edge-emitting lasers, to form a modular photonic system. In some embodiments, multiple vertically arranged arrays of edge-emitting lasers are stacked within the modular photonic system.

In some embodiments, the method further comprises packaging multiple vertically arranged arrays of edge-emitting lasers with optical components and drive electronics, to form an interposer platform.

In some embodiments, the method further comprises packaging multiple vertically arranged arrays of edge-emitting lasers with optical components and drive electronics, to form a photonic chipset.

Some variations of the invention provide a vertically arranged array of edge-emitting lasers produced by a process comprising:

(a) obtaining a plurality of semiconductor chips, wherein the semiconductor chips are laser diodes or semiconductor optical amplifiers;

(b) coating each of the semiconductor chips on multiple sides with a thermally conductive dielectric material;

(c) bonding the semiconductor chips onto a carrier wafer at selected locations, wherein the semiconductor chips are vertically aligned relative to a surface of the carrier wafer;

(d) coating each of the semiconductor chips with an electroplating seed material;

(e) obtaining a body wafer having lithographically defined and passivated openings within a plane of the body wafer;

(f) positioning the body wafer and the carrier wafer to match the lithographically defined and passivated openings with the semiconductor chips;

(g) electroplating a metal-containing material onto the electroplating seed material to fill open space between the semiconductor chips and the lithographically defined and passivated openings;

(h) demounting the body wafer from the carrier wafer;

(i) etching excess material, if any, from the body wafer; and (j) patterning a plurality of metal regions in electrical contact with the plurality of semiconductor chips, thereby generating a vertically arranged array of edge-emitting lasers that is capable of emitting laser light parallel to the semiconductor chips and perpendicular to the plane of the body wafer.

In some embodiments, the vertically arranged array of edge-emitting lasers does not contain a coupling structure. A "coupling structure" refers to a structure that is designed to rotate light so that the light can emit out-of-plane, rather than from an edge. Conventionally, coupling structures are bulky and/or associated with laser-light losses. An example of a coupling structure is described by Tsai et al., "Three-dimensional coupling structure for a high power laser diode module", *OSA Continuum*, Vol. 4, No. 10, 2021, which is hereby incorporated by reference. Another type of coupling structure is a grating. Grating structures require both large amounts of space (typically thousands of pairs of quarter-wavelength features) and have efficiencies below 60%. In addition, grating structures are heavily dependent in their coupling on the optical wavelength and the polarization of the beam, meaning the structure may further drop in efficiency during operation as the wavelength thermally red-shifts and possibly switches polarization states. Preferably, the vertically arranged array of edge-emitting lasers, as disclosed herein, has no coupling structures.

The lithographically defined and passivated openings are characterized by an average cavity length, and the vertically arranged array of edge-emitting lasers is characterized by an average array pitch, which is the spacing between adjacent semiconductor chips, measured center-to-center (distance between midpoints). In some embodiments, the average array pitch is less than the average cavity length in at least one planar dimension. In certain embodiments (e.g., FIG. 3B), the average array pitch is less than the average cavity length in two planar dimensions. In various embodiments, the average array pitch is at least about 10%, 20%, 30%, 40%, 50%, 60%, 70%, 80%, or 90% smaller than the average cavity length in one planar dimension or in two planar dimensions. The array pitch may be uniform (i.e., constant across all adjacent semiconductor chips) in one or two planar dimensions, or the array pitch may be non-uniform. When the array pitch is non-uniform, the average array pitch in one planar dimension may be different than the average array pitch in the other planar dimension. Alternatively, or additionally, the average array pitch may be non-uniform within a given planar dimension.

In some embodiments, the vertically arranged array of edge-emitting lasers is a two-dimensional or three-dimensional vertically arranged array of edge-emitting lasers.

In some embodiments, the vertically arranged array of edge-emitting lasers is present in a stacked arrangement of multiple vertically arranged arrays of edge-emitting lasers.

Some embodiments provide a modular photonic system comprising (i) one or more vertically arranged arrays of edge-emitting lasers and (ii) passive photonic elements. The modular photonic system is a non-planar photonic system, in certain embodiments.

Some embodiments provide an interposer platform comprising (i) multiple vertically arranged arrays of edge-emitting lasers, (ii) optical components, and (iii) drive electronics.

Some embodiments provide a photonic chipset comprising (i) multiple vertically arranged arrays of edge-emitting lasers, (ii) optical components, and (iii) drive electronics.

In certain variations, an intermediate structure is obtained and potentially stored for a period of time or shipped to another site for further processing. For example, an intermediate structure could be the electroplated structure obtained after completing step (g), but before the body wafer is demounted from the carrier wafer. As another example, an intermediate structure could be the demounted objected obtained after completing step (h), but before etching in step (i) or patterning metal regions in step (j). As yet another example, an intermediate structure could be the objected with excess material etched away, obtained after completing step (i), but before the metal regions are patterned in step (j).

Some variations of the invention provide a vertically arranged array of edge-emitting lasers comprising:

a plurality of vertically aligned semiconductor chips each coated on multiple sides with a thermally conductive dielectric material, wherein the semiconductor chips are laser diodes or semiconductor optical amplifiers;

a body wafer having lithographically defined and passivated openings within a plane of the body wafer, wherein each of the vertically aligned semiconductor chips is positioned within individual lithographically defined and passivated openings;

an electroplated metal-containing material filled in space between the semiconductor chips and the lithographically defined and passivated opening; and a plurality of metal regions in electrical contact with the plurality of semiconductor chips, wherein the vertically arranged array of edge-emitting lasers is capable of emitting laser light parallel to the semiconductor chips and perpendicular to the plane of the body wafer.

The vertically arranged array of edge-emitting lasers preferably does not contain any coupling structures.

The lithographically defined and passivated openings are characterized by an average cavity length. In some embodiments, the vertically arranged array of edge-emitting lasers is characterized by an average array pitch that is less than the average cavity length in at least one planar dimension.

In some embodiments, an electroplating seed material is disposed between the electroplated metal-containing material and the semiconductor chips.

In some embodiments, the vertically arranged array of edge-emitting lasers is a two-dimensional vertically arranged array of edge-emitting lasers.

In some embodiments, the vertically arranged array of edge-emitting lasers is a three-dimensional vertically arranged array of edge-emitting lasers.

In some embodiments, the vertically arranged array of edge-emitting lasers is present in a stacked arrangement of multiple vertically arranged arrays of edge-emitting lasers.

Some embodiments provide a modular photonic system (e.g., a non-planar photonic system) comprising (i) one or more vertically arranged arrays of edge-emitting lasers and (ii) passive photonic elements, wherein each vertically arranged array of edge-emitting lasers comprises:

a plurality of vertically aligned semiconductor chips each coated on multiple sides with a thermally conductive dielectric material, wherein the semiconductor chips are laser diodes or semiconductor optical amplifiers;

a body wafer having lithographically defined and passivated openings within a plane of the body wafer, wherein each of the vertically aligned semiconductor chips is positioned within individual lithographically defined and passivated openings;

an electroplated metal-containing material filled in space between the semiconductor chips and the lithographically defined and passivated opening; and a plurality of metal regions in electrical contact with the plurality of semiconductor chips, wherein the vertically arranged array of edge-emitting lasers is capable of emitting laser light parallel to the semiconductor chips and perpendicular to the plane of the body wafer.

Some embodiments provide an interposer platform comprising (i) multiple vertically arranged arrays of edge-emitting lasers, (ii) optical components, and (iii) drive electronics, wherein each vertically arranged array of edge-emitting lasers comprises:

a plurality of vertically aligned semiconductor chips each coated on multiple sides with a thermally conductive dielectric material, wherein the semiconductor chips are laser diodes or semiconductor optical amplifiers;

a body wafer having lithographically defined and passivated openings within a plane of the body wafer, wherein each of the vertically aligned semiconductor chips is positioned within individual lithographically defined and passivated openings;

an electroplated metal-containing material filled in space between the semiconductor chips and the lithographically defined and passivated opening; and a plurality of metal regions in electrical contact with the plurality of semiconductor chips, wherein the vertically arranged array of edge-emitting lasers is capable of emitting laser light parallel to the semiconductor chips and perpendicular to the plane of the body wafer.

Some embodiments provide a photonic chipset comprising (i) multiple vertically arranged arrays of edge-emitting lasers, (ii) optical components, and (iii) drive electronics, wherein each vertically arranged array of edge-emitting lasers comprises:

a plurality of vertically aligned semiconductor chips each coated on multiple sides with a thermally conductive dielectric material, wherein the semiconductor chips are laser diodes or semiconductor optical amplifiers;

a body wafer having lithographically defined and passivated openings within a plane of the body wafer, wherein each of the vertically aligned semiconductor chips is positioned within individual lithographically defined and passivated openings;

an electroplated metal-containing material filled in space between the semiconductor chips and the lithographically defined and passivated opening; and a plurality of metal regions in electrical contact with the plurality of semiconductor chips, wherein the vertically arranged array of edge-emitting lasers is capable of emitting laser light parallel to the semiconductor chips and perpendicular to the plane of the body wafer.

Various embodiments of the technology will now be further discussed in reference to the accompanying drawings, which are not intended to limit the scope of the invention, but rather illustrate those embodiments as well as many principles of the invention.

Figure 1D:
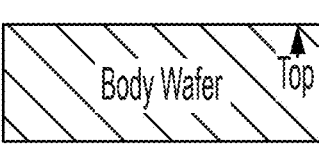
FIG. 1D is a side-view schematic of an exemplary process step for forming vertically arranged arrays of lasers, in which a body wafer is chosen whose thickness is greater than the longest laser diode cavity length.
Figure 1B:
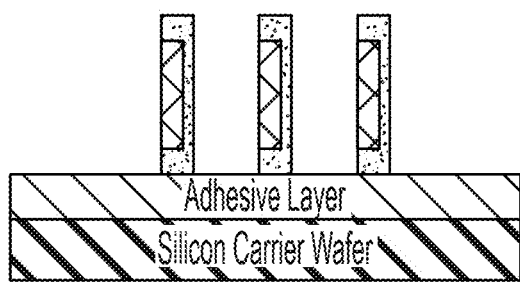
FIG. 1B is a side-view schematic of an exemplary process step for forming vertically arranged arrays of lasers, in which a carrier wafer is prepared with alignment marks beneath an adhesive and the laser diodes are aligned vertically onto them using precision placement.
Figure 1E:
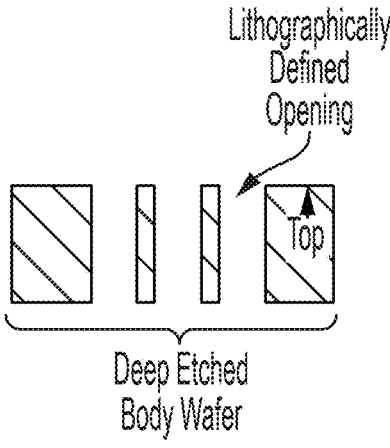
FIG. 1E is a side-view schematic of an exemplary process step for forming vertically arranged arrays of lasers, in which lithographically defined openings in the body wafer are etched away through the full wafer thickness.
Figure 1C:
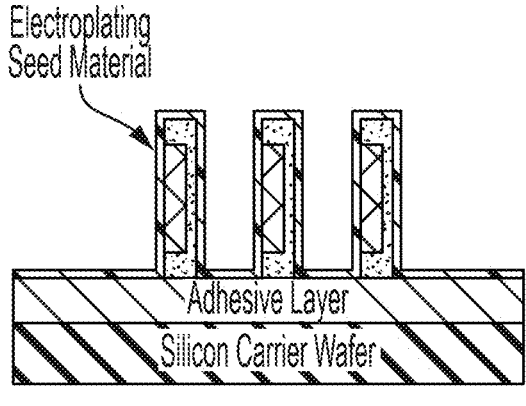
FIG. 1C is a side-view schematic of an exemplary process step for forming vertically arranged arrays of lasers, in which an electroplating seed is coated over a different five sides of the vertically positioned die.
Figure 1F:
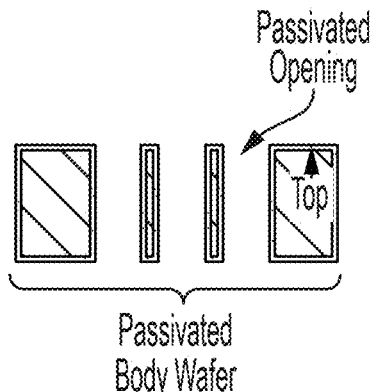
FIG. 1F is a side-view schematic of an exemplary process step for forming vertically arranged arrays of lasers, in which the body wafer is passivated on all exposed openings.

FIGS. 1A to 1L collectively depict a schematic of an exemplary process flow for forming vertically arranged arrays of lasers, from the side view. The process for the carrier wafer preparation proceeds as follows. In FIG. 1A, laser diodes (or other types of semiconductor chips) with known laser cavity lengths are procured and coated in a thermal coating dielectric on five sides. In FIG. 1B, a carrier wafer is prepared with alignment marks beneath an adhesive and the laser diodes are aligned vertically onto them using precision placement. In FIG. 1C, an electroplating seed is coated over a different five sides of the vertically positioned die. Separately, a body wafer preparation proceeds as follows. In FIG. 1D, a body wafer is chosen whose thickness is greater than the longest laser diode cavity length. In FIG. 1E, lithographically defined openings in the body wafer are etched away through the full wafer thickness. In FIG. 1F, the body wafer is passivated on all exposed openings. The body and carrier wafer are then brought together as follows. In FIG. 1G, the body wafer is flipped over and positioned to match its etched openings to the laser diodes. In FIG. 1H, electroplating is performed to fill up the etched openings with metal around each laser diode. In FIG. 1I, the body wafer is demounted from the carrier wafer adhesive. In FIG. 1J, the demounted body wafer is flipped over. In FIG. 1K, the excess electroplated metal and thermal coating are etched from the topmost face of the laser diodes to open up the top laser facet. Finally, in FIG. 1L, metal contacts are patterned and formed to contact to the exposed laser diode contacts.

FIG. 2A shows a cross-section of an array of laser diodes that have been positioned vertically and secured in the interposer wafer surrounding them by use of electroplated metal. FIG. 2B shows a top-down view of a single laser diode die in the same interposer. The output laser beam is shown in both FIG. 2A and FIG. 2B, where in the cross-section (FIG. 2A) it emits upwards and in the top-down view (FIG. 2B) the laser beam emits from the laser diode out of the page. In both depictions, the electroplated metal acts as the cathode and ground terminal for the vertically arranged devices. This is shown by the ground terminals in both FIG. 2A and FIG. 2B. The top contact acts as the anode and current injection point.

Figure 3B:
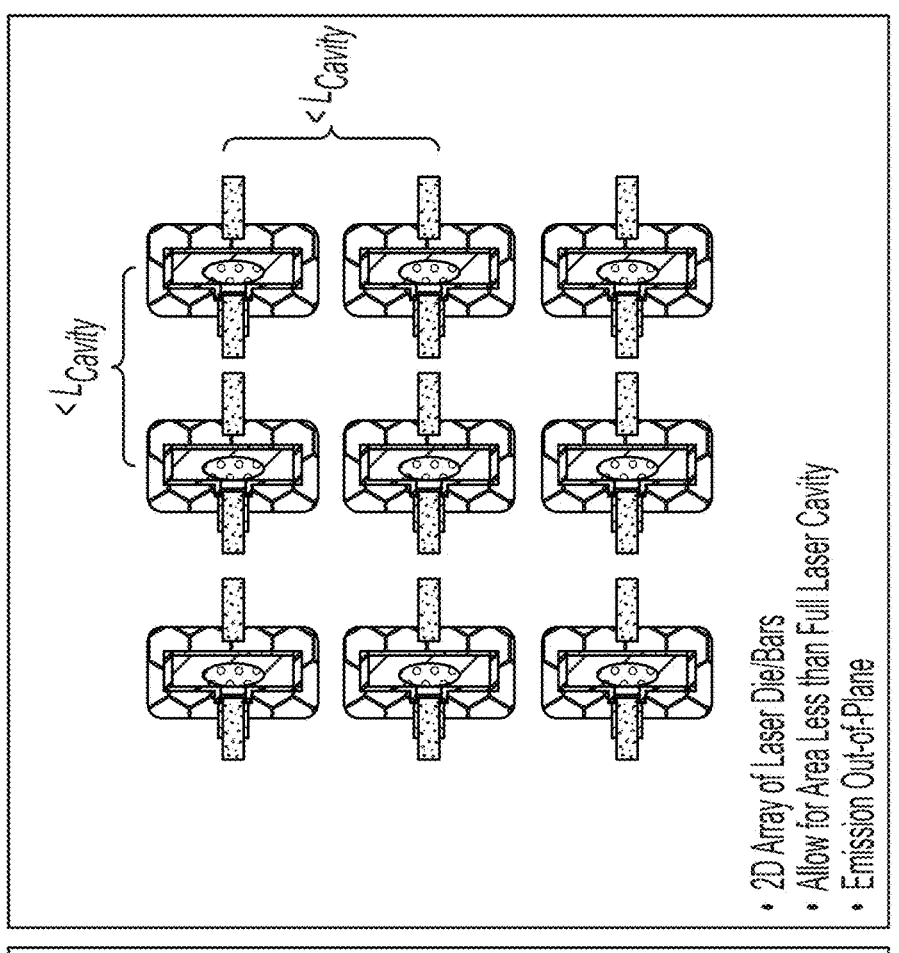
FIG. 3B depicts an exemplary 2D array that places the lasers vertically and allows for an area footprint less than the laser cavity length per laser, in some embodiments. The laser emission is out-of-plane.
Figure 3B:
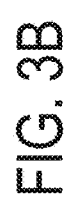
Figure 3A:
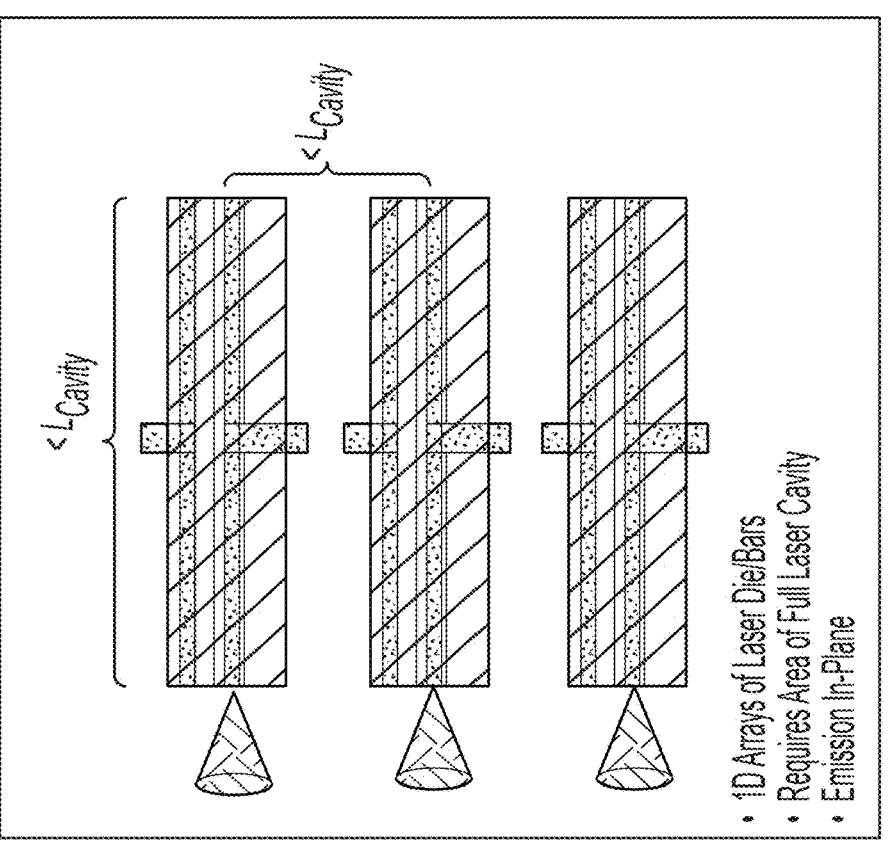
FIG. 3A depicts a state-of-the-art 1D array that places the full lasers on their side, requiring an area footprint scaling with the laser cavity length. The laser emission is in-plane.

FIGS. 3A and 3B provide a top-down comparison of a possible arrangement of laser diodes in some variations of the present invention versus the state-of-the-art. FIG. 3A depicts a state-of-the-art 1D array that places the full lasers on their side, requiring an area footprint scaling with the laser cavity length ($L_{Cavity}$). The emission is in-plane. FIG. 3B depicts an exemplary 2D array that places the lasers vertically and allows for an area footprint less than the laser cavity length per laser. The spacing between adjacent semiconductor chips is the array pitch. The emission is out-of-plane.

Figure 4B:
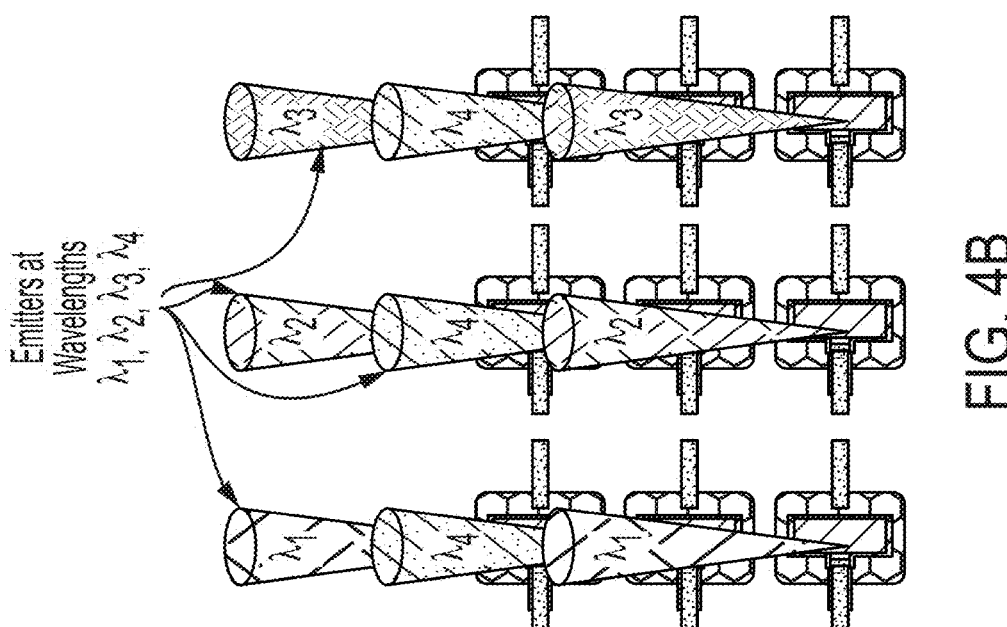
FIG. 4B depicts an exemplary laser diode laser arrays emitting with multiple wavelengths grouped together.
Figure 4A:
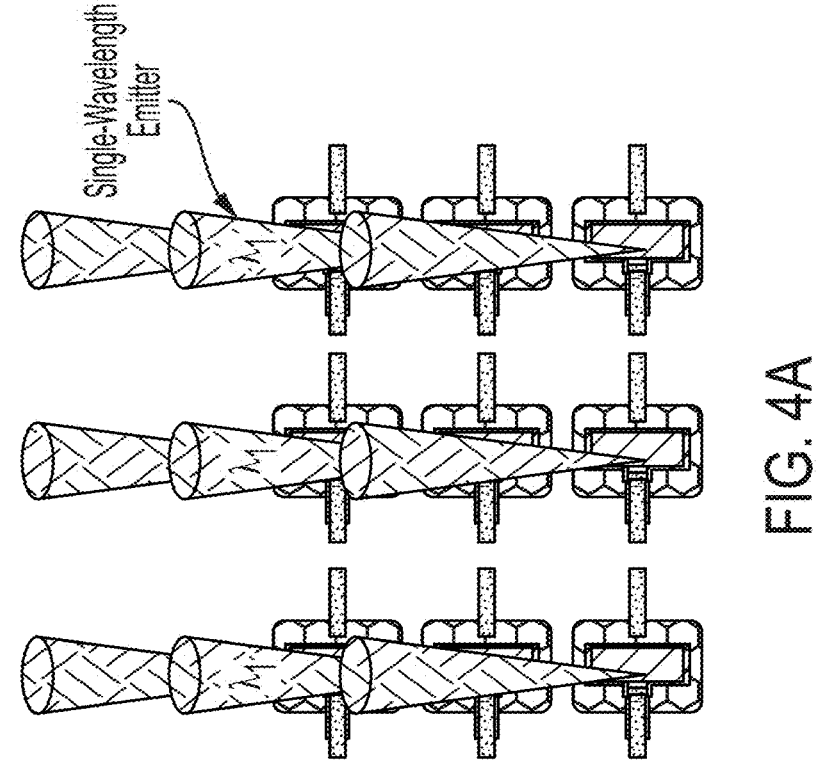
FIG. 4A depicts an exemplary laser diode laser array emitting as a series of single-wavelength emitters.

FIGS. 4A and 4B depict exemplary laser diode laser arrays, emitting as either a series of single-wavelength emitters (FIG. 4A) or multiple wavelengths grouped together (FIG. 4B).

Figure 5A:
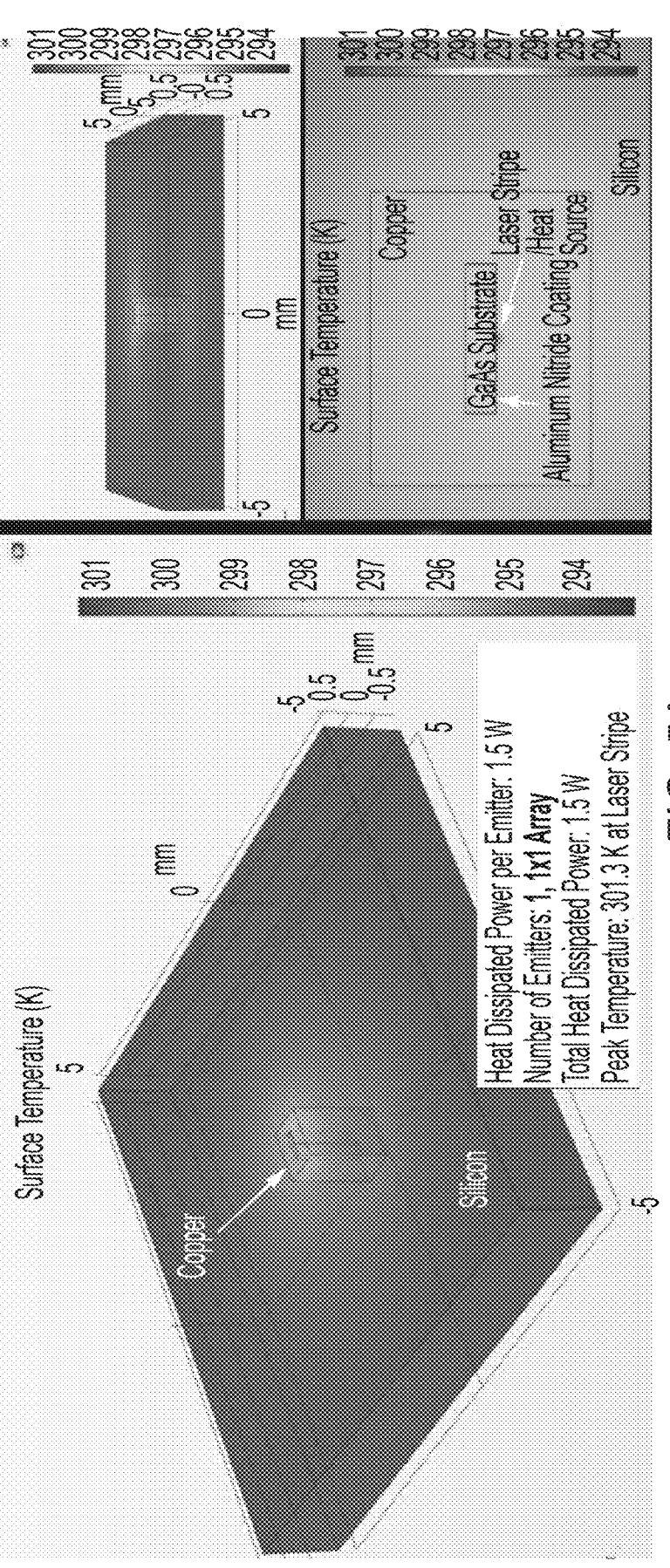
FIG. 5A illustrates a simulation showing a single laser diode surrounded by thermal coating (aluminum nitride) in a 1.5-mm-thick silicon interposer, in some embodiments (peak temperature is about 301 K).
Figures 1, 5B:
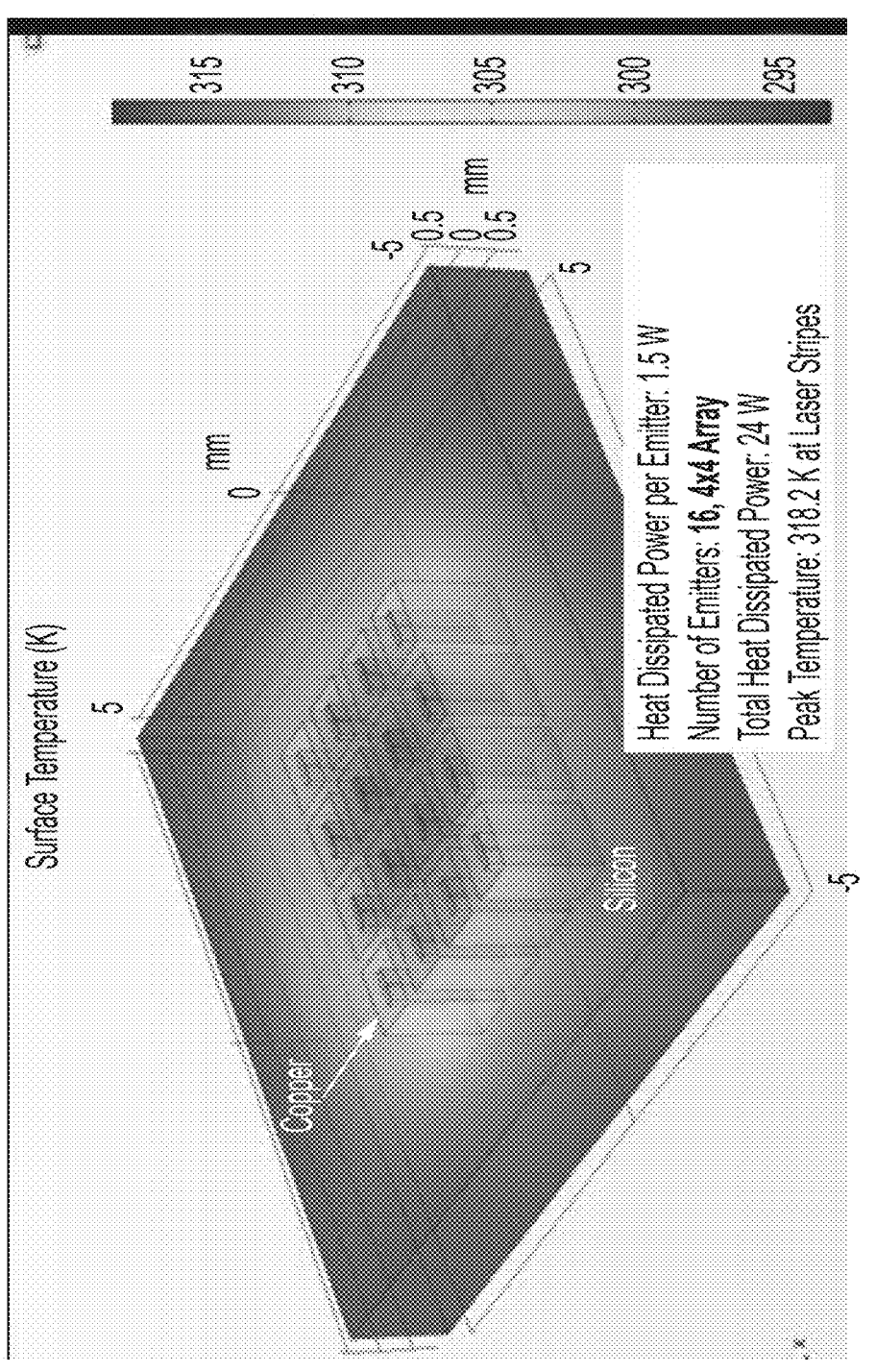
FIGS. 5B-1 and 5B-2 illustrate a simulation showing an array of 16 (4×4) laser diodes each surrounded by thermal coating (aluminum nitride) in the same 1.5-mm-thick silicon interposer (peak temperature is about 318 K), demonstrating that the interposer efficiently conducts away heat into the thermal heat sink.
Figures 2, 5B:
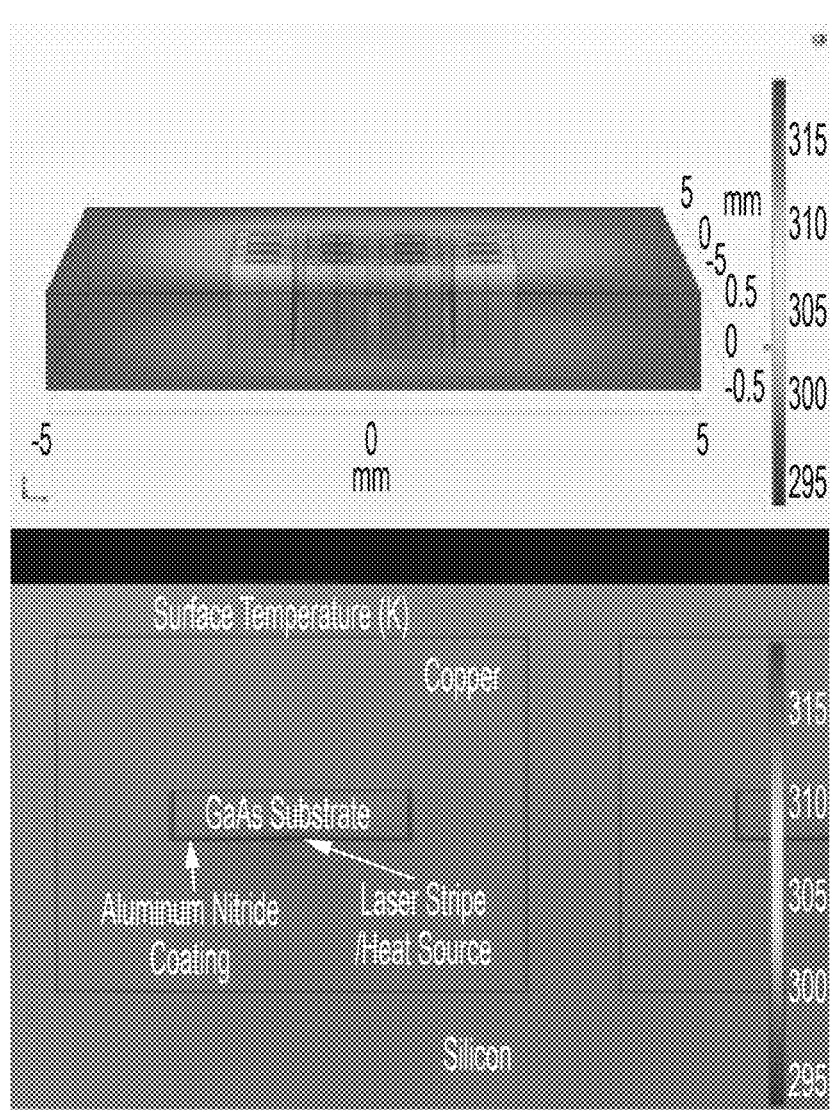
Figure 5C:
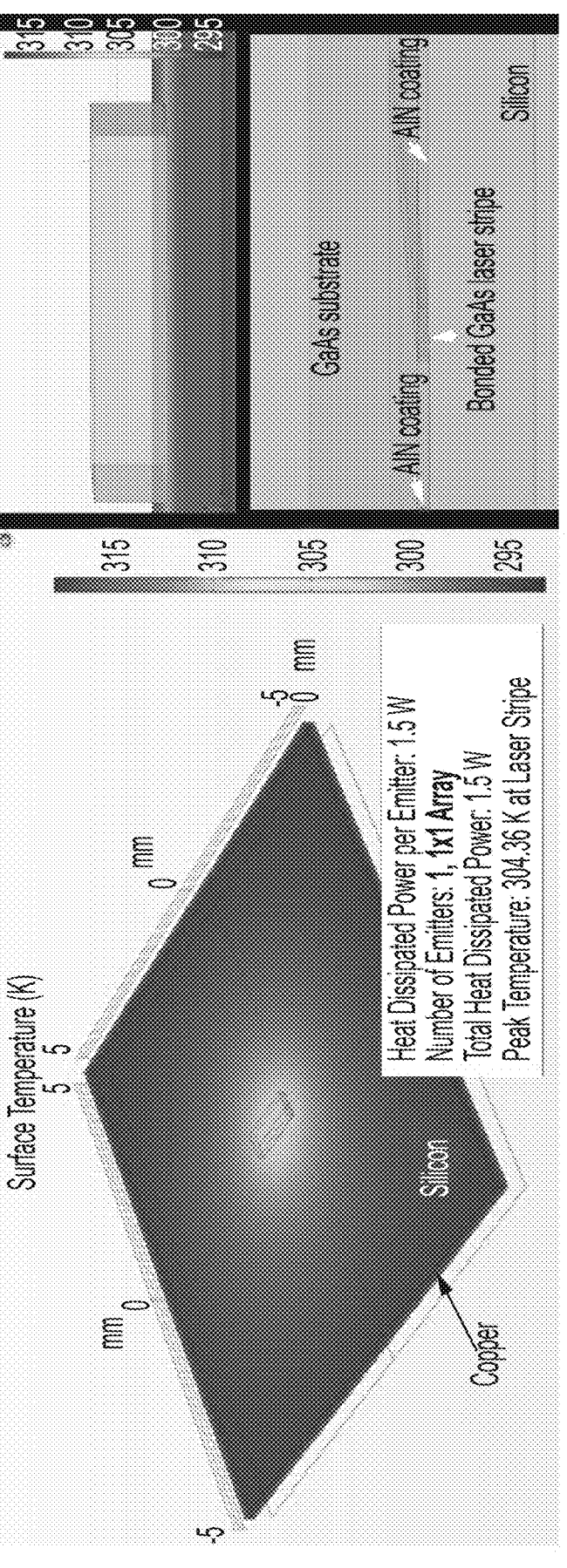
FIG. 5C illustrates a simulation showing the same laser diode and thermal coating as in FIG. 5A, but mounted on a thinned 100 μm silicon interposer with copper coating on the backside of the interposer (peak temperature is about 304 K).

FIGS. 5A, 5B, 5C show simulation results revealing how electroplated copper surrounding a vertically-arranged laser diode acts as an improved thermal heat sink. Each laser diode is set to have a wall-plug efficiency of ~28% for 600 mW of optical output power, imputing a thermally dissipated power per die at 1.5 W. FIG. 5A illustrates a first simulation showing a single laser diode surrounded by thermal coating (aluminum nitride) in a 1.5-mm-thick silicon interposer. The peak temperature is ~301 K. FIGS. 5B-1 and 5B-2 illustrate a second simulation showing an array of 16 (4×4) laser diodes each surrounded by thermal coating (aluminum nitride) in the same 1.5-mm-thick silicon interposer, and from this it is seen that the peak temperature is at ~318 K, which is a relatively small increase from ambient temperature (about 298 K). This confirms that the interposer successfully conducts away much of the heat by way of the aluminum nitride surrounding each die in thermal heat sink. FIG. 5C illustrates a third simulation showing the same laser diode and thermal coating but mounted on a thinned 100 μm silicon interposer with copper coating on the backside of the interposer. In this approach, the peak temperature is ~304 K.

Figure 6:
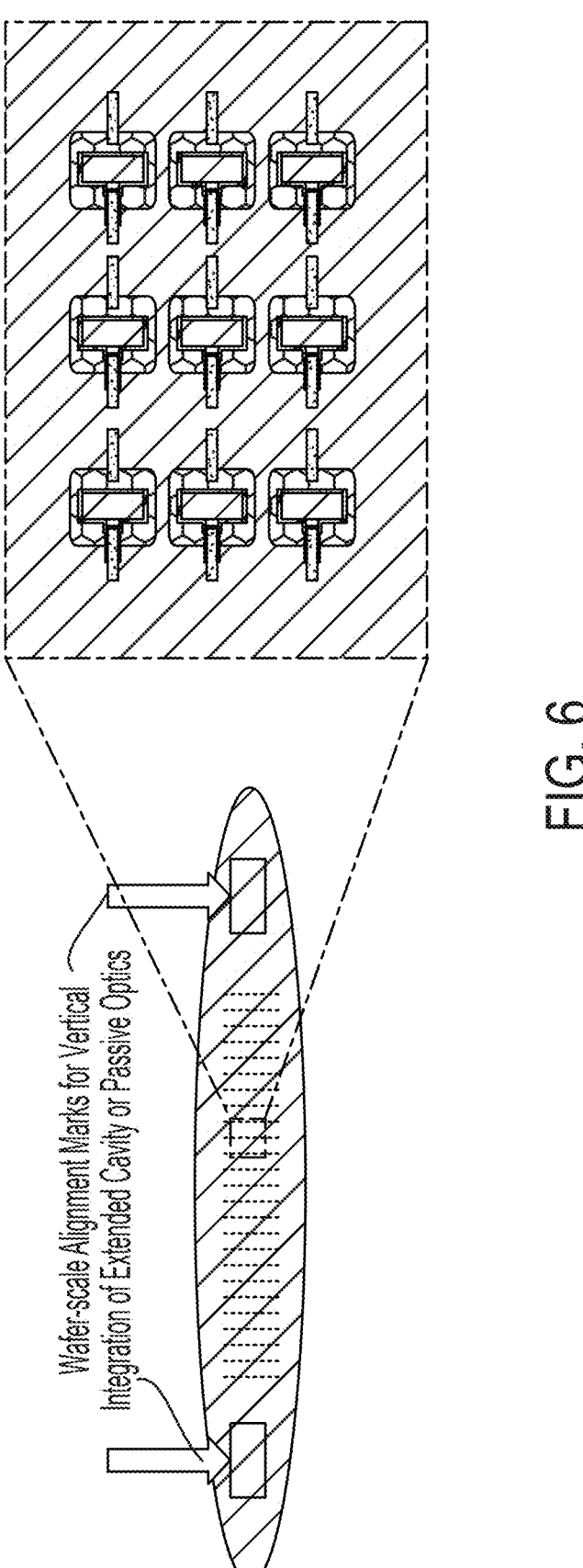
FIG. 6 depicts a single reconstructed interposer wafer with individual laser diodes embedded in a 2D array inside of the wafer, via metal-embedded chip assembly, in some embodiments.

FIG. 6 depicts a single reconstructed interposer wafer with individual laser diodes embedded inside of the wafer, via metal-embedded chip assembly. The inset of FIG. 6 shows a 2D array of laser diodes. Large alignment marks can be defined into the interposer so that subsequent layers of passive optical elements may be stacked above the active devices.

Figure 7:
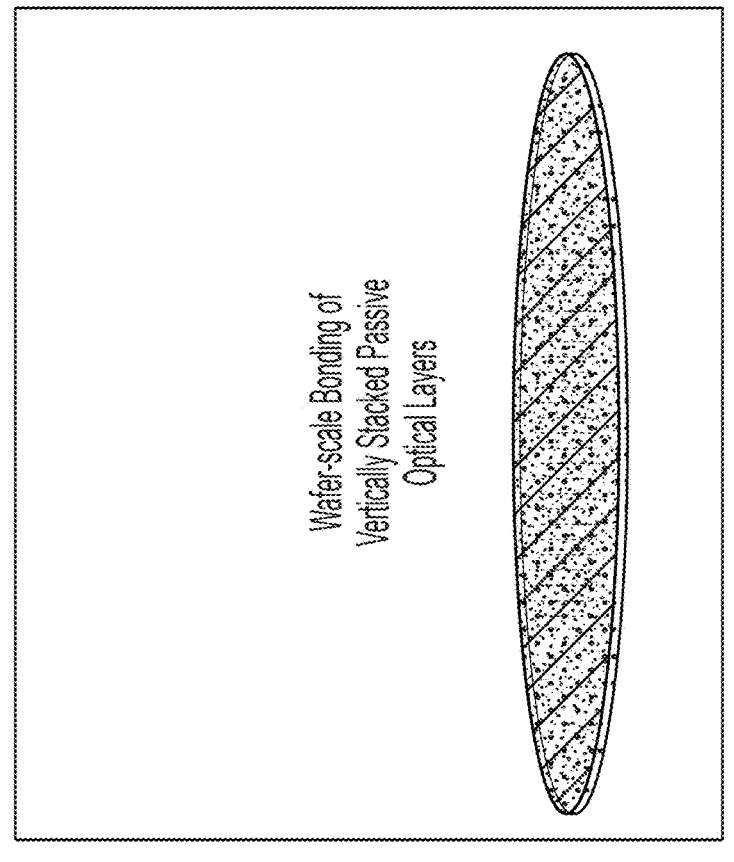
FIG. 7 depicts a wafer-stacking process that bonds additional passive layers to the top of the interposer containing the laser diode array, in some embodiments.
Figure 7:
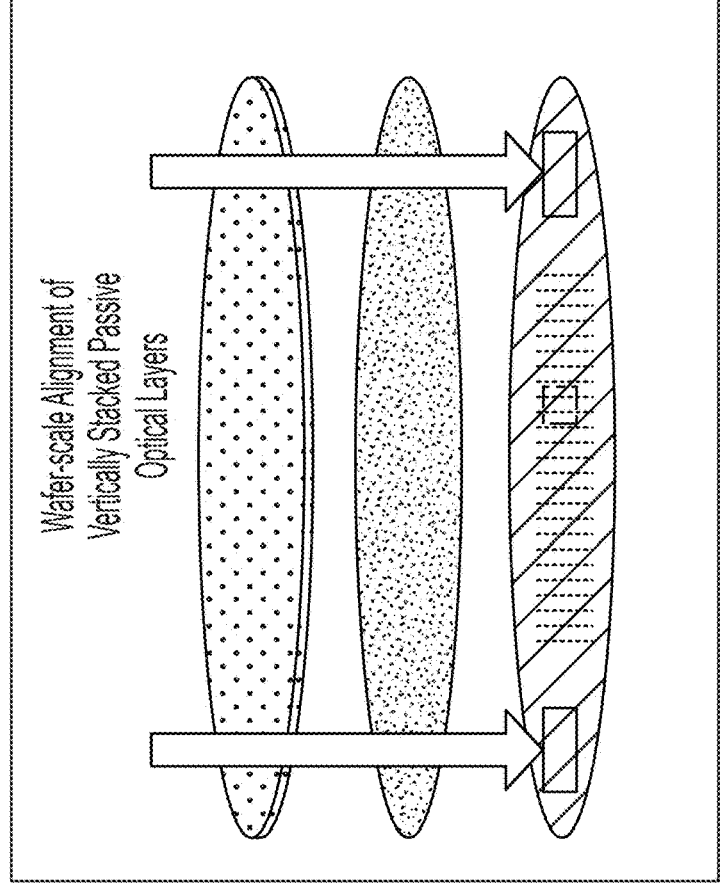

FIG. 7 depicts a wafer-stacking process that bonds additional passive layers to the top of the interposer containing the laser diode array. Global alignment at the wafer scale allows for lithographic precision in attaching other optical elements to the top of the laser cavity. The bonded stack of the interposer with laser diodes and any passive layers is shown on the right side of FIG. 7.

Figure 8A:
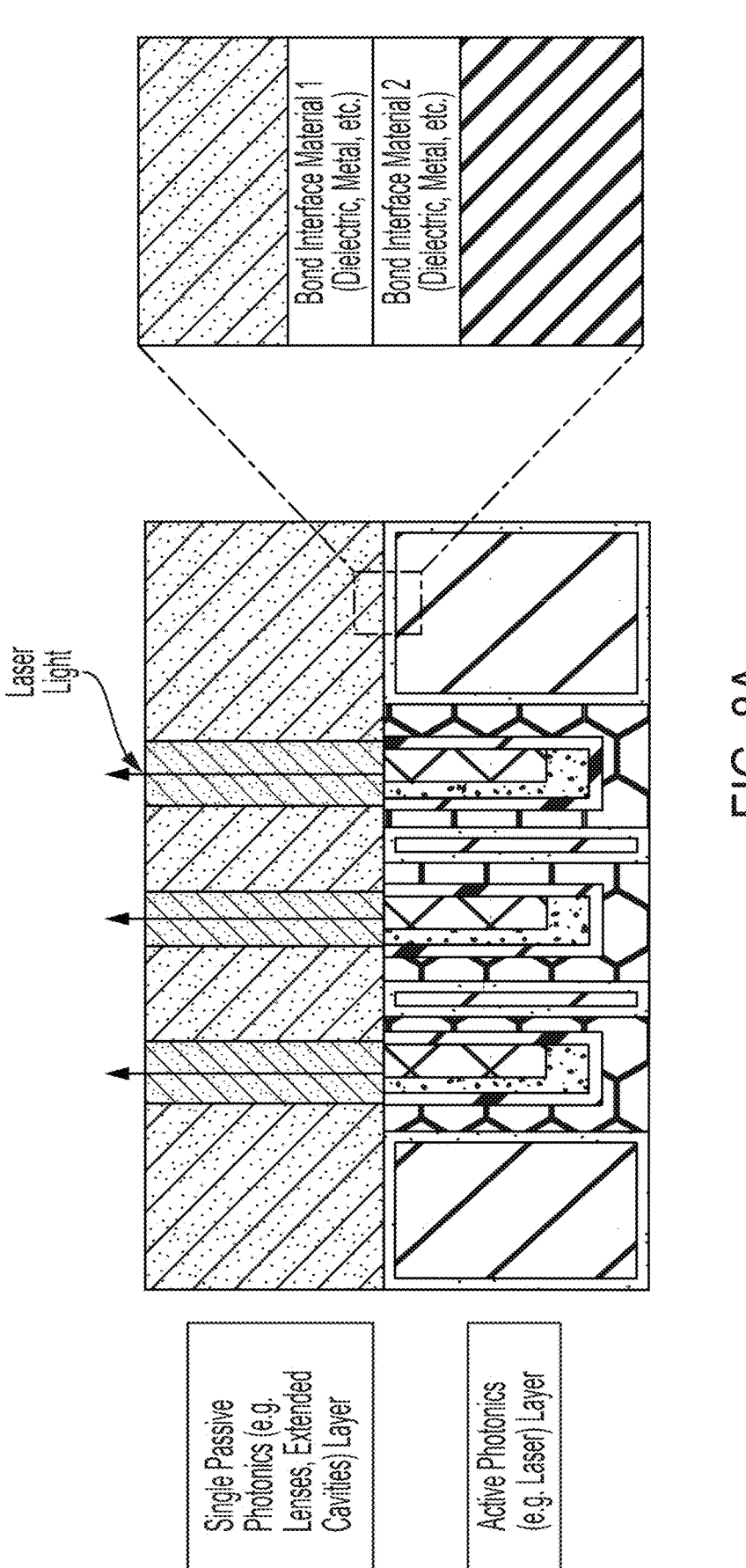
FIG. 8A (cross-section view) depicts the interface of a passive photonics layer and the active interposer layer composed of a thin-film bond for oxide bonding or eutectic bonding, in some embodiments, where the passive photonics layer contains microlenses, optical spacers, optical filters, waveguiding structures, passive photonic integrated circuits, external cavities, waveplates, etc.
Figure 8B:
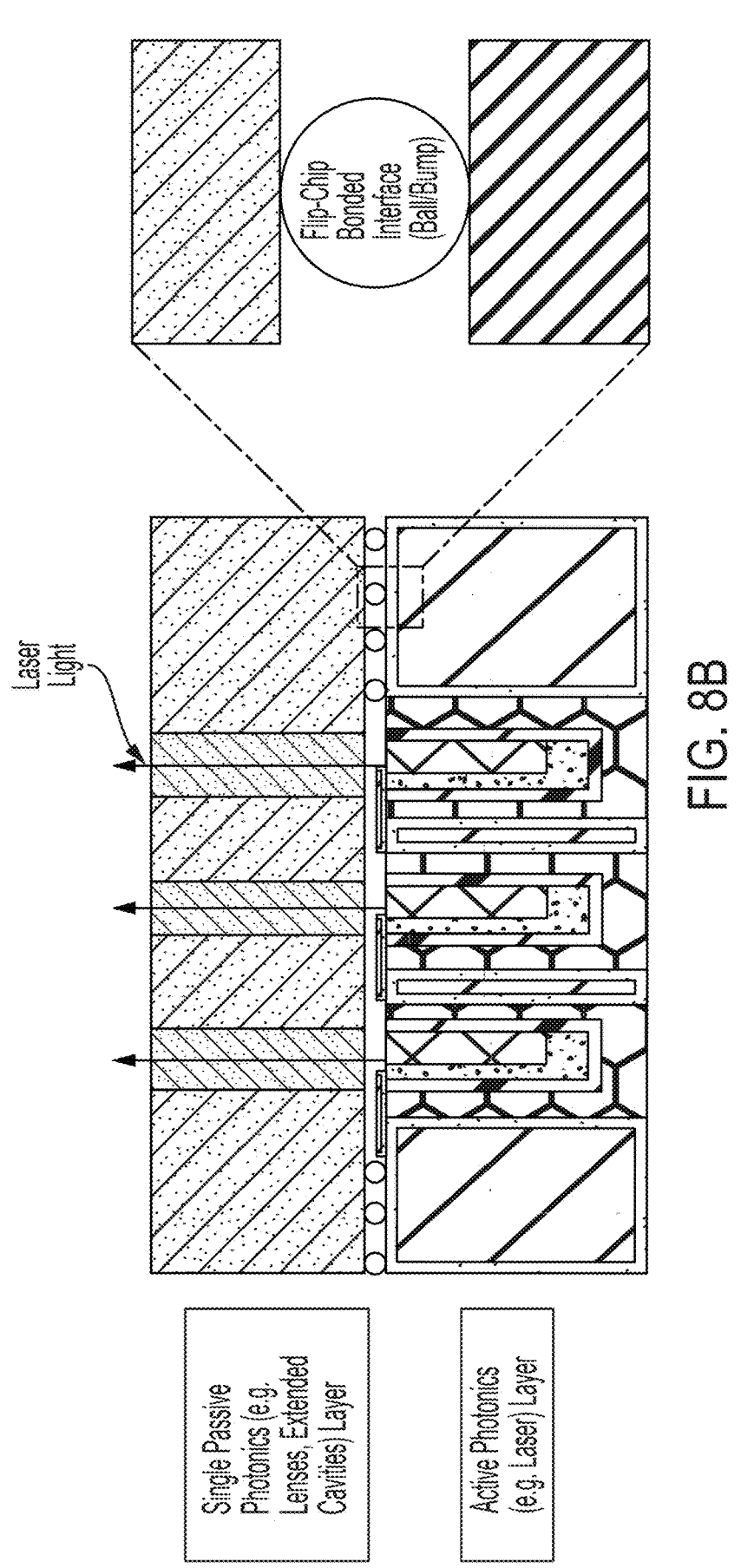
FIG. 8B (cross-section view) depicts an alternative option compared to FIG. 8A, showing the same interface between the aligned passive wafer and active interposer wafer but bonded by means of a flip-chip solder bump or solder ball array, in some embodiments.

FIGS. 8A and 8B are cross-section views of the interface between the interposer containing the laser diode array and a single passive photonics layer above it. Light emits vertically from the opened end of the laser diode at the top of the interposer and is then propagated through one or more optically passive layers, such as microlenses, optical spacers, optical filters, waveguiding structures, passive photonic integrated circuits, external cavities, waveplates, etc. FIG. 8A depicts the interface of the passive layer and the active interposer layer as being composed of a thin-film bond, such as made of oxides or metals for oxide bonding or eutectic bonding, respectively. This would produce the most direct and intimate bond interface between the layers. FIG. 8B depicts an alternative option, showing the same interface between the aligned passive wafer and active interposer wafer but bonded by means of a flip-chip solder bump or solder ball array (e.g., ball grid array). This option separates the layers by 10-500 μm and thus is less intimate, although useful to intentionally terminate the laser cavity at the laser diode and thus add only lensing above.

Figure 9:
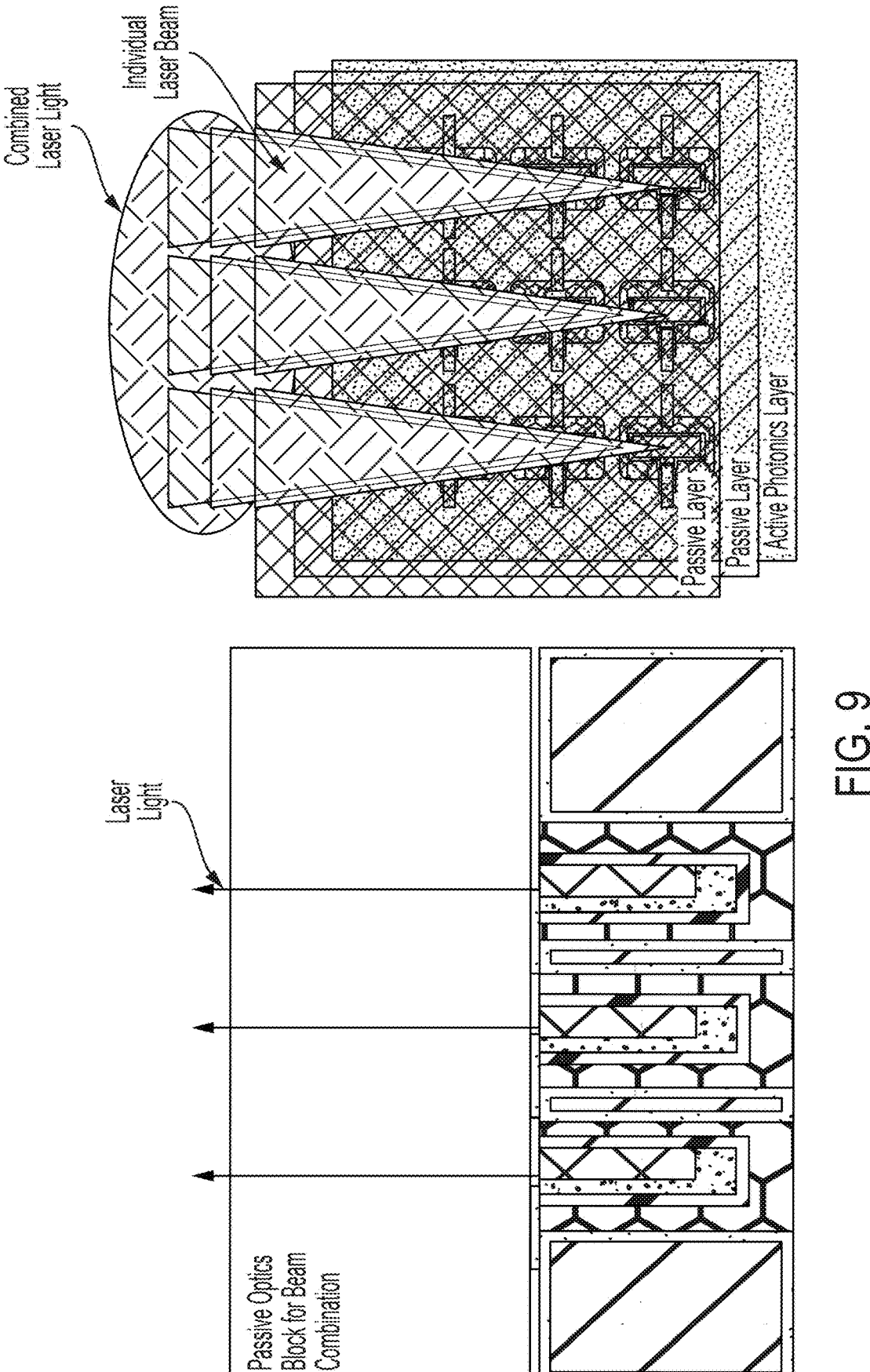
FIG. 9 shows cross-section (left) and isometric (right) views of an exemplary implementation of the wafer-stacking approach to create a beam combiner of multiple laser diodes assembled in an array, where the passive optics block may be used for collimation and/or for phase adjustment modulators or PICs for each individual laser diode to ensure that they can combine coherently at the desired far-field point of interest.

FIG. 9 shows cross-section (left) and isometric (right) views of an exemplary implementation of the wafer-stacking approach to create a beam combiner of multiple laser diodes assembled in an array. Multiple individual laser beams are combined into a combined laser beam, as depicted in the isometric view of FIG. 9, for illustration purposes. The beam combiner may generate a spectral or wavelength beam combination, a coherent beam combination, etc. The passive optics block, in this implementation, may be used for collimation and/or for phase adjustment modulators or PICs for each individual laser diode to ensure that they can combine coherently at the desired far-field point of interest.

Figure 10:
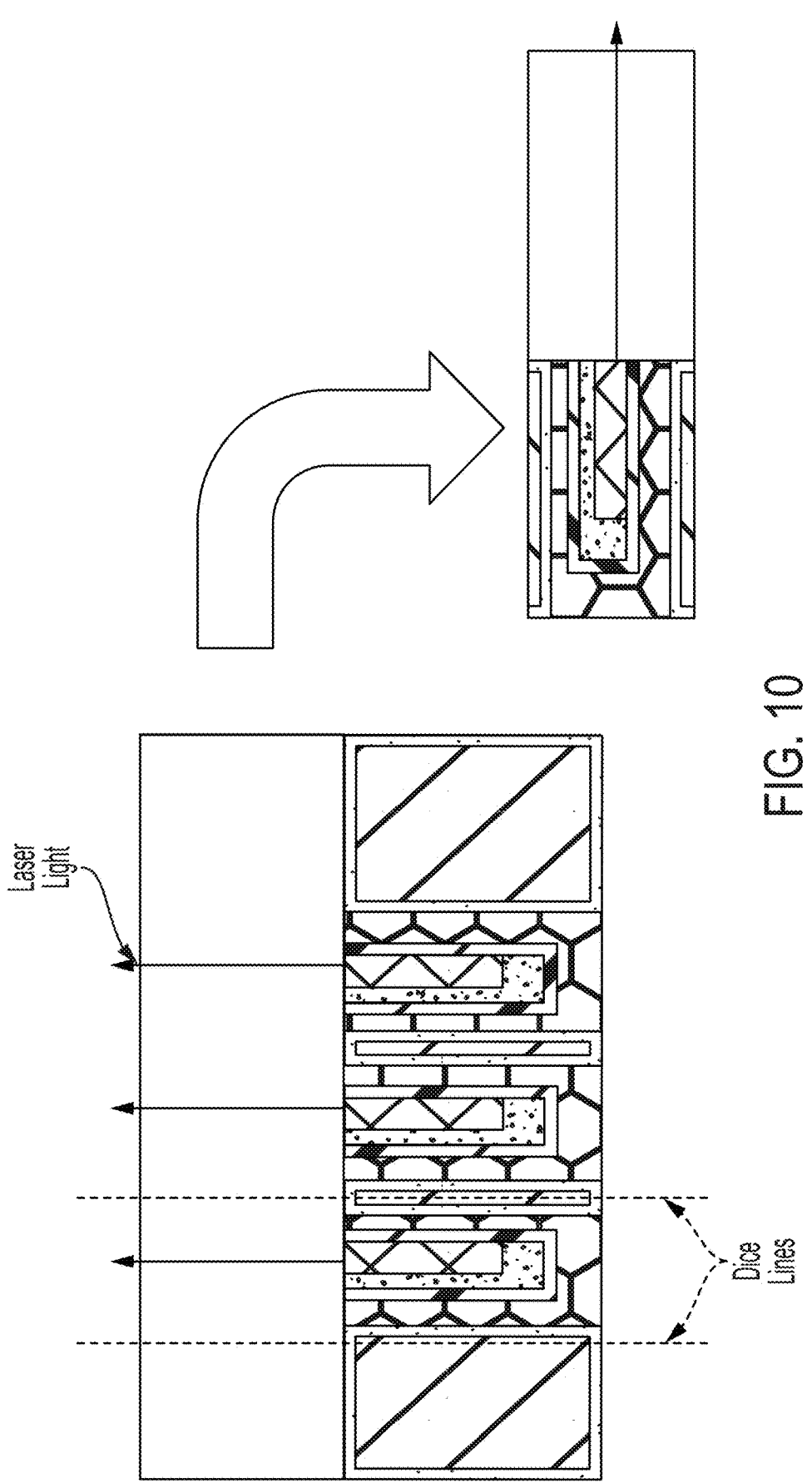
FIG. 10 shows a cross-section of an exemplary implementation in which assembly of passive layers bonded and stacked modularly onto the active interposer are diced into individual die (or bars) and then placed back on their side for insertion into an in-plane micro-optics bench.

FIG. 10 shows a cross-section of an exemplary implementation. In this case, the assembly of passive layers bonded and stacked modularly onto the active interposer are then diced into individual die (or bars) and then rotated on their side for insertion into an in-plane micro-optics bench.

The assembled module on its side (right side of FIG. 10) has the same laser cavity length as does the upright cavity (left side of FIG. 10). This implementation allows all of the optical elements to be intimately bonded using lithographic alignment and bonding techniques first, eliminating the need for individual x-y-z alignment of each element in-plane. The vertical stacking is thus used as a transitory means to align and orient elements relative to the laser diode before final placement of the laser diode on its side as needed.

Figure 11:
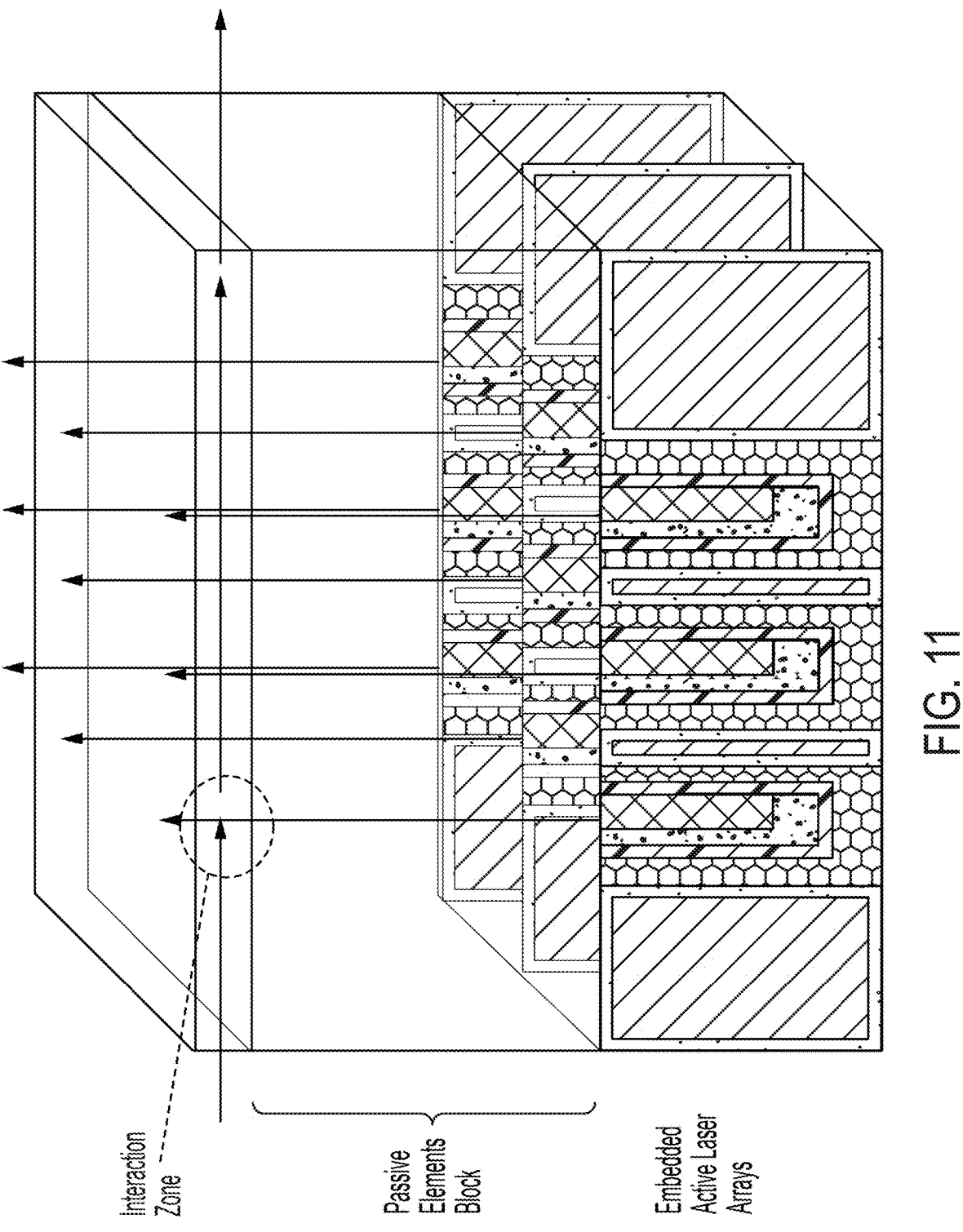
FIG. 11 is an isometric drawing depicting an exemplary implementation in which embedded laser diodes inside the interposer create optical beams that emit vertically, and the emitted beams pass through a passive elements block for lensing, filtering, or reducing spectral noise, before entering another layer which contains optical beams passing through laterally.

FIG. 11 is an isometric drawing depicting another exemplary implementation of the invention. In this implementation, the embedded laser diodes inside the interposer create optical beams that emit vertically. These emitted beams pass through a passive elements block for lensing, filtering, reducing spectral noise, for example, before finally entering another layer which contains optical beams passing through laterally. The vertical beam and the in-plane beam in the topmost layer cross paths at a designated point to achieve a desired interaction.

All publications, patents, and patent applications cited in this specification are herein incorporated by reference in their entirety as if each publication, patent, or patent application were specifically and individually put forth herein.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A method for making a vertically arranged array of edge-emitting lasers, said method comprising:
   (a) obtaining a plurality of semiconductor chips, wherein said semiconductor chips are laser diodes or semiconductor optical amplifiers;
   (b) coating each of said semiconductor chips on multiple sides with a thermally conductive dielectric material;
   (c) bonding said semiconductor chips onto a carrier wafer at selected locations, wherein said semiconductor chips are vertically aligned relative to a surface of said carrier wafer;
   (d) coating each of said semiconductor chips with an electroplating seed material;
   (e) obtaining a body wafer having lithographically defined and passivated openings within a plane of said body wafer;
   (f) positioning said body wafer and said carrier wafer to match said lithographically defined and passivated openings with said semiconductor chips;

(g) electroplating a metal-containing material onto said electroplating seed material to fill open space between said semiconductor chips and said lithographically defined and passivated openings;
   (h) demounting said body wafer from said carrier wafer;
   (i) etching excess material, if any, from said body wafer; and
   (j) patterning a plurality of metal regions in electrical contact with said plurality of semiconductor chips,
   thereby generating a vertically arranged array of edge-emitting lasers that is capable of emitting laser light parallel to said semiconductor chips and perpendicular to said plane of said body wafer.

2. The method of claim 1, wherein said semiconductor chips are fabricated from a semiconductor selected from the group consisting of GaAs, InP, GaSb, GaN, InGaN, AlGaN, AlGaInP, GaInP, GaAlAs, InGaAs, InGaAsP, GaInAsSb, and combinations thereof.

3. The method of claim 1, wherein said semiconductor chips are capable of emitting or amplifying ultraviolet laser light, visible laser light, infrared laser light, or a combination thereof.

4. The method of claim 1, wherein said semiconductor chips are each configured to emit or amplify at a single light wavelength.

5. The method of claim 1, wherein said semiconductor chips are collectively configured to emit or amplify at multiple light wavelengths.

6. The method of claim 1, wherein said thermally conductive dielectric material is selected from the group consisting of aluminum nitride, boron nitride, tantalum oxide, beryllium oxide, aluminum oxide, and combinations thereof.

7. The method of claim 1, wherein step (b) comprises coating each of said semiconductor chips on five sides with said thermally conductive dielectric material.

8. The method of claim 1, wherein step (c) utilizes an adhesive for said bonding.

9. The method of claim 8, wherein said adhesive is selected from the group consisting of polyimide, cyanoacrylate, acrylic, polyepoxides, polyethylene, polystyrene, ceramics, benzocyclobutene, parylene, and combinations thereof.

10. The method of claim 1, wherein said body wafer is fabricated from a body-wafer material selected from the group consisting of silicon, silicon carbide, germanium, gallium nitride, aluminum nitride, gallium oxide, silica, alumina, and combinations thereof.

11. The method of claim 1, wherein said carrier wafer is fabricated from a carrier-wafer material selected from the group consisting of silicon, silicon carbide, germanium, gallium nitride, aluminum nitride, gallium oxide, silica, alumina, and combinations thereof.

12. The method of claim 1, wherein said electroplating seed material is selected from the group consisting of copper, ruthenium, molybdenum, cobalt, titanium, platinum, gold, silver, nickel, chromium, aluminum, tantalum nitride, and combinations thereof.

13. The method of claim 1, wherein step (d) comprises coating each of said semiconductor chips on five sides with said electroplating seed material.

14. The method of claim 1, wherein said lithographically defined and passivated openings are characterized by an average cavity length, and wherein said vertically arranged array of edge-emitting lasers is characterized by an average array pitch that is less than said average cavity length in at least one planar dimension.

15. The method of claim 1, wherein step (e) comprises obtaining a starting body wafer, etching said starting body wafer to create etched openings, and then passivating said etched openings to create said lithographically defined and passivated openings.

16. The method of claim 15, wherein said passivating utilizes (i) native oxidation of said etched openings, (ii) deposition of an oxide layer onto said etched openings, and/or (iii) deposition of a nitride layer onto said etched openings.

17. The method of claim 1, wherein said metal-containing material in step (g) is selected from the group consisting of copper, ruthenium, molybdenum, cobalt, titanium, gold, silver, nickel, aluminum, indium, tin, and combinations thereof.

18. The method of claim 1, wherein said metal-containing material is chemically the same as said electroplating seed material.

19. The method of claim 1, wherein said metal-containing material is chemically different than said electroplating seed material.

20. The method of claim 1, wherein step (i) comprises etching excess thermally conductive dielectric material.

21. The method of claim 1, wherein step (i) comprises etching excess electroplating seed material.

22. The method of claim 1, wherein step (i) comprises etching excess metal-containing material.

23. The method of claim 1, wherein step (i) comprises etching said excess material from the top side of said body wafer that was previously in contact with said carrier wafer prior to step (h).

24. The method of claim 1, wherein said metal regions in step (j) contain a metal selected from the group consisting of copper, nickel, titanium, platinum, palladium, rhodium, gold, silver, and combinations thereof.

25. The method of claim 1, wherein said vertically arranged array of edge-emitting lasers is a two-dimensional vertically arranged array of edge-emitting lasers.

26. The method of claim 1, wherein said vertically arranged array of edge-emitting lasers is a three-dimensional vertically arranged array of edge-emitting lasers.

27. The method of claim 1, wherein said method further comprises stacking passive photonic elements along with said vertically arranged array of edge-emitting lasers, to form a modular photonic system.

28. The method of claim 27, wherein multiple vertically arranged arrays of edge-emitting lasers are stacked within said modular photonic system.

29. The method of claim 1, wherein said method further comprises packaging multiple vertically arranged arrays of edge-emitting lasers with optical components and drive electronics, to form an interposer platform.

30. The method of claim 1, wherein said method further comprises packaging multiple vertically arranged arrays of edge-emitting lasers with optical components and drive electronics, to form a photonic chipset.

* * * * *